United States Patent
Nozaki

(10) Patent No.: US 7,869,059 B2
(45) Date of Patent: Jan. 11, 2011

(54) HEIGHT-LIMIT CALCULATION APPARATUS, HEIGHT-LIMIT CALCULATION METHOD, METHOD OF MANUFACTURING THREE-DIMENSIONAL STRUCTURE, AND COMPUTER PRODUCT

(75) Inventor: Naoyuki Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 793 days.

(21) Appl. No.: 11/699,493

(22) Filed: Jan. 30, 2007

(65) Prior Publication Data
US 2008/0079952 A1 Apr. 3, 2008

(30) Foreign Application Priority Data
Sep. 28, 2006 (JP) ............................. 2006-265886

(51) Int. Cl.
*G01B 11/24* (2006.01)
(52) U.S. Cl. .................... 356/601; 356/301; 356/613; 356/628; 700/98; 700/117; 700/182
(58) Field of Classification Search ................. 356/301, 356/603, 625, 628, 631; 700/98, 117, 119, 700/118, 182, 103, 97
See application file for complete search history.

(56) References Cited

U.S. PATENT DOCUMENTS 6,518,966 B1   2/2003   Nakagawa
6,606,788 B1 *  8/2003   Morimoto et al. ............. 29/832
2008/0189080 A1 *  8/2008   Tenma et al. .................... 703/1
2009/0128648 A1 *  5/2009   Ikeda et al. ................. 382/145

FOREIGN PATENT DOCUMENTS

| JP | 11-073434 | 3/1999 |
| JP | 11-328445 | 11/1999 |
| JP | 2003-196324 | 7/2003 |

OTHER PUBLICATIONS

Japanese Office Action for Corresponding Application No. JP 2006-265886, mailed on Aug. 31, 2010.

* cited by examiner

*Primary Examiner*—Gregory J Toatley
*Assistant Examiner*—Iyabo S Alli
(74) *Attorney, Agent, or Firm*—Staas & Halsey LLP

(57) ABSTRACT

A height-limited-area-information creating device creates a clip plane on a base plane of a printed circuit board, and sets a view so that an image faces the base plane and a normal to the base plane represents a depth direction of the image. According to the view, a three-dimensional image of a chassis-side component is created. The base plane is divided into unit areas, and one of the unit areas is selected. Coordinates of vertices of the selected unit area are transformed to screen coordinates to acquire a component and a polygon at the position of the screen coordinates. Distances from respective four vertices to the polygon are calculated as height, and a minimum value is determined as a maximum height for the unit area.

13 Claims, 21 Drawing Sheets

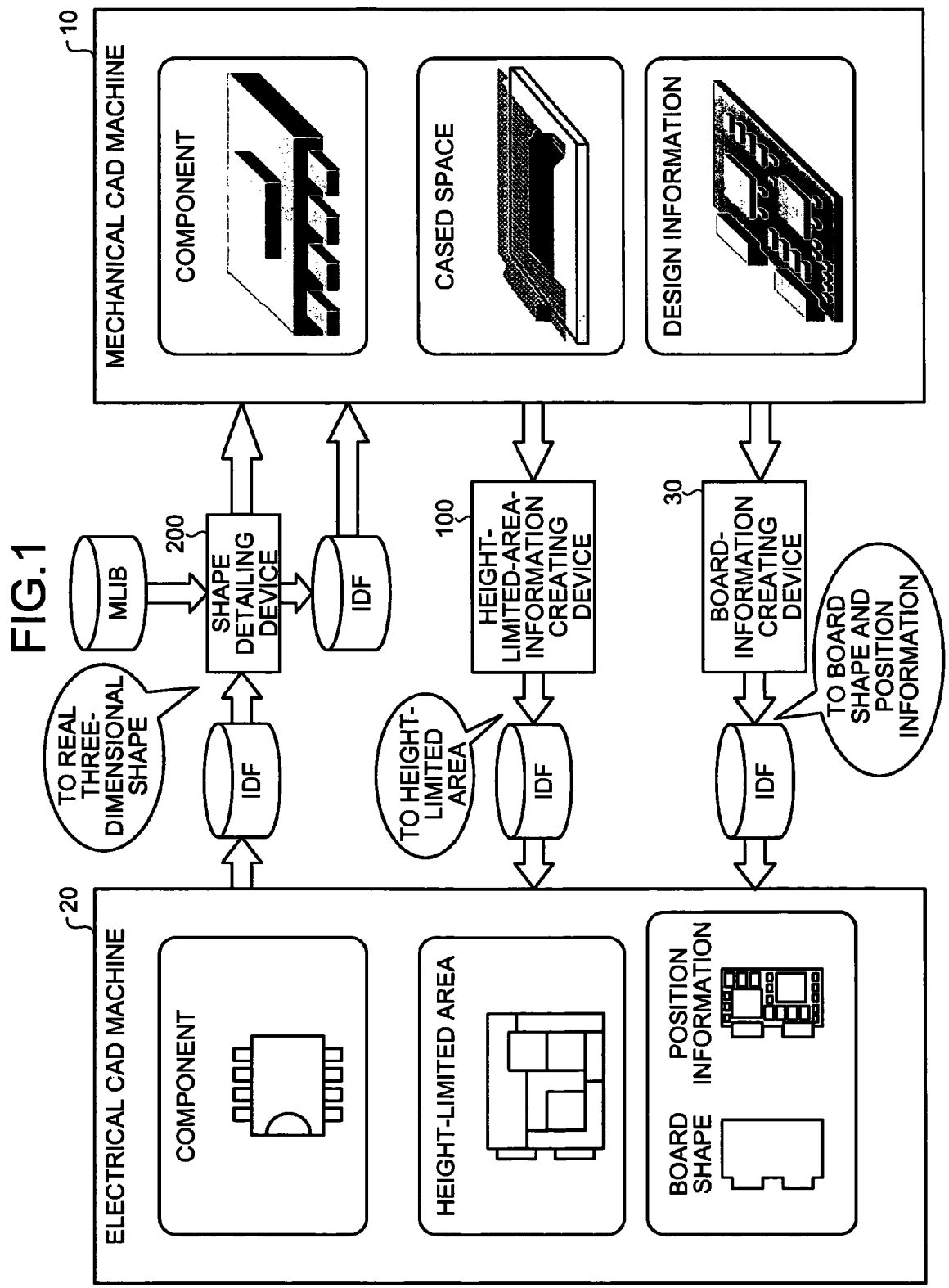

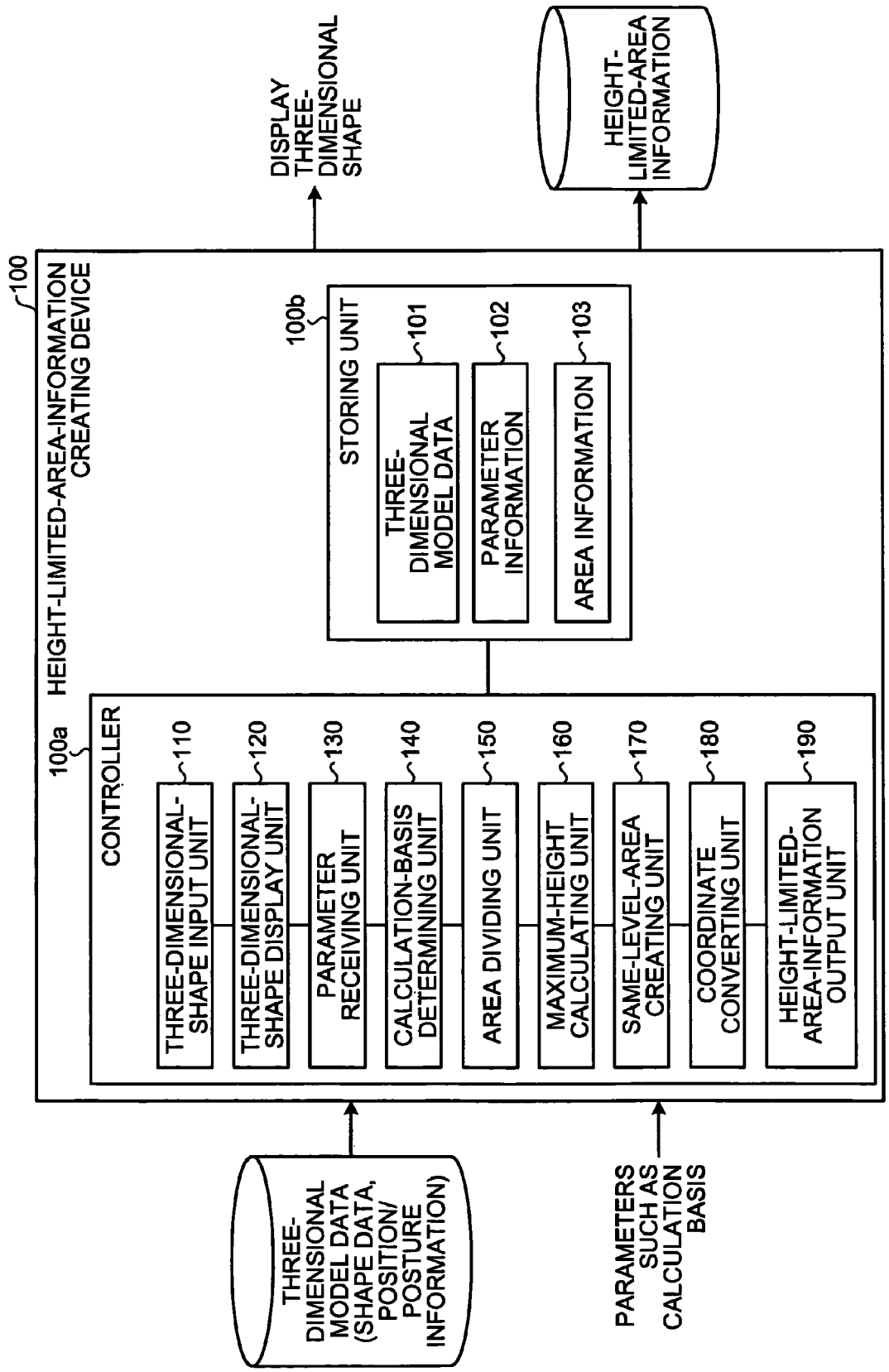

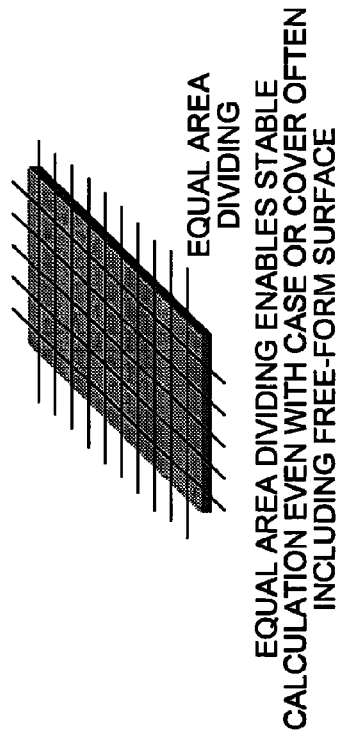
FIG.3A
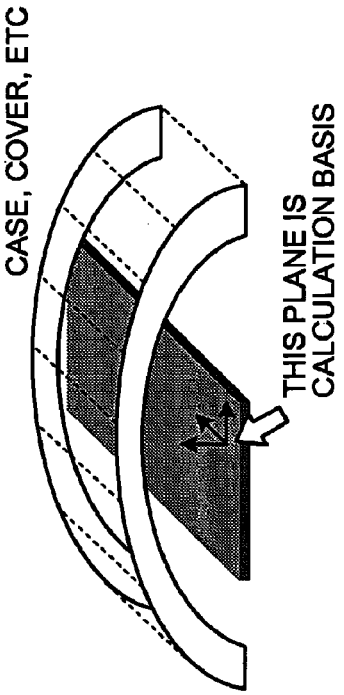
FIG.3B
FIG.3C
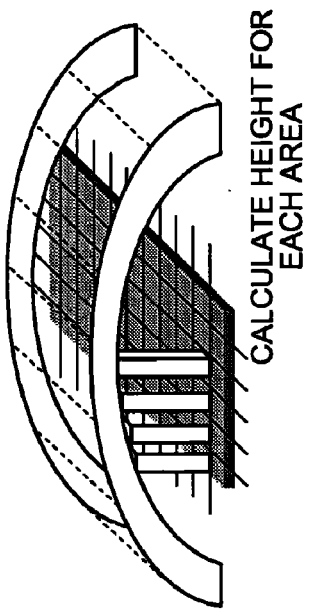
FIG.3D
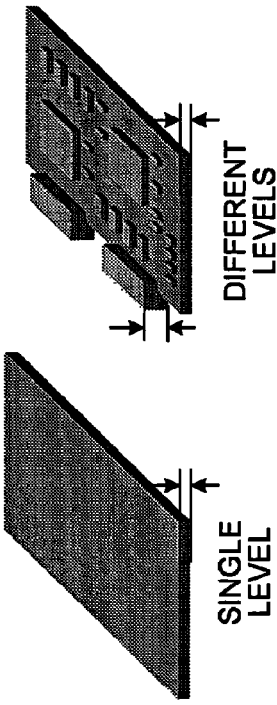
FIG.3E
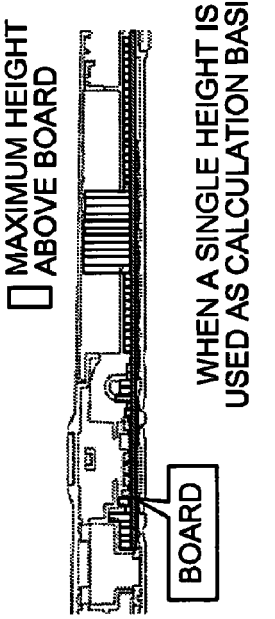
FIG.3F
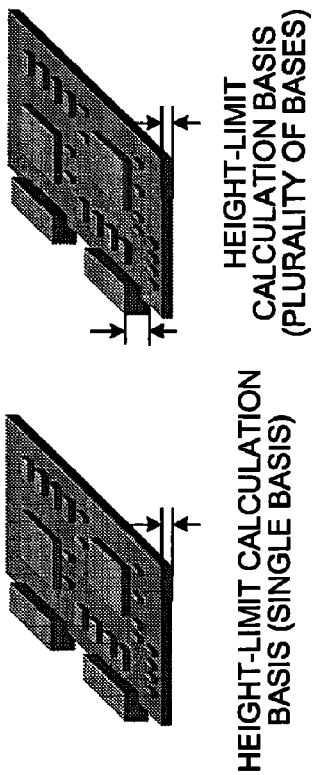

VERTICAL DIRECTION N

DEFINE CLIP PLANE ON PRINTED CIRCUIT BOARD (TARGET PLANE)

IMAGE OF CROSS SECTION AT CLIP PLANE WITH VERTICAL DIRECTION DIRECTED TO BACK OF IMAGE A

DISPLAYED IMAGE

VERTICAL DIRECTION N

ONE BOX IS A DISPLAYED PIXEL (EACH PIXEL IS RECORDED WITH COLOR, DEPTH, AND NAME)

IMAGE DATA IN FRAME BUFFER

IN THIS EXAMPLE, BECAUSE SOLID POLYGON IS CLOSER THAN DOTTED POLYGON (TO PRINTED CIRCUIT BOARD), PIXELS OF SOLID POLYGON ARE INDICATED

DIVIDE PRINTED CIRCUIT BOARD

CONVERT VERTEXES OF GRID THAT DIVIDES PRINTED CIRCUIT
BOARD FROM THREE-DIMENSIONAL COORDINATES INTO TWO-
DIMENSIONAL COORDINATES ON SCREEN AND ACQUIRE POLYGON
INFORMATION OF CORRESPONDING PIXELS.
CENTER OF GRID CAN BE USED INSTEAD OF FOUR VERTEXES.

FIG.6F
RESULT OF PROCESSING ALL GRIDS AND SRROUNDING EACH
AREA OF SAME HEIGHT
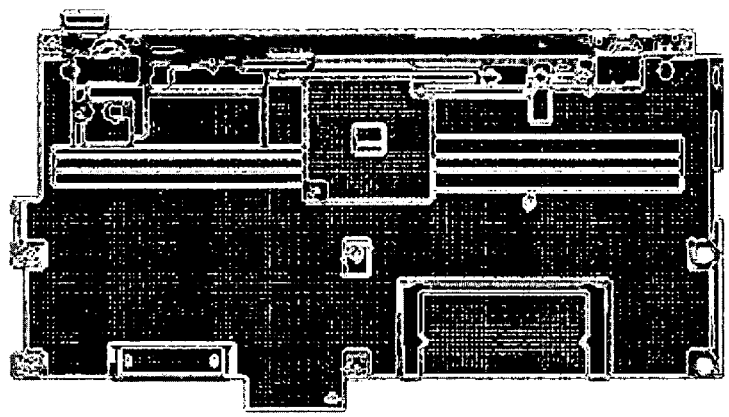
RESULT IN
LATERAL VIEW 

FIG.12

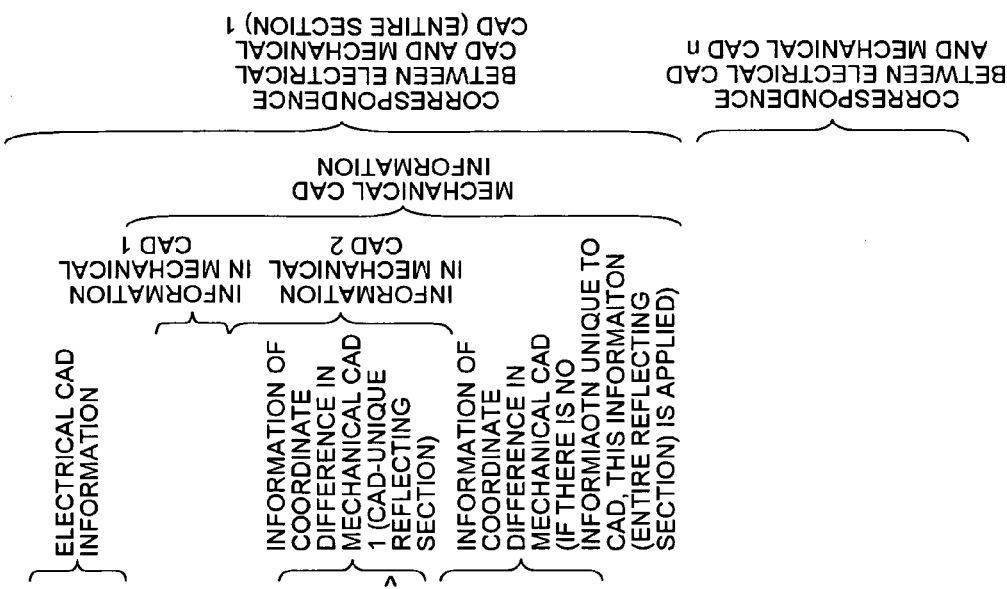

```
<REPLACEMENT-COMPONENT MANAGEMENT>
<ELECTRICAL CAD>
<COMPONENT IDENTIFIER>a12345-0001</COMPONENT IDENTIFIER>
<SHAPE LIBRARY NAME>AA1234</SHAPE LIBRARY NAME>
</ELECTRICAL CAD.>
<MECHANICAL CAD>
<CAD1>
<COMPONENT IDENTIFIER>AB12345-0001</COMPONENT IDENTIFIER>
</CAD1>
<CAD2>
<COMPONENT IDENTIFIER>AB12345-0001</COMPONENT IDENTIFIER>
<COORDINATE DIFFERENCE>
<X COORDINATE DIFFERENCE>10.0</X COORDINATE DIFFERENCE>
<Y COORDINATE DIFFERENCE>20.0</Y COORDINATE DIFFERENCE>
<Z COORDINATE DIFFERENCE>-5.0</Z COORDINATE DIFFERENCE>
<ROTATING COORDINATE DIFFERENCE>90.0 0.0 180.0</ROTATING COORDINATE DIFFERENCE>
</COORDINATE DIFFERENCE>
</CAD2>
<COORDINATE DIFFERENCE>
<X COORDINATE DIFFERENCE>0.0</X COORDINATE DIFFERENCE>
<Y COORDINATE DIFFERENCE>0.0</Y COORDINATE DIFFERENCE>
<Z COORDINATE DIFFERENCE>0.0</Z COORDINATE DIFFERENCE>
<ROTATING COORDINATE DIFFERENCE>0.0 0.0 90.0</ROTATING COORDINATE DIFFERENCE>
</COORDINATE DIFFERENCE>
</MECHANICAL CAD>
</REPLACEMENT-COMPONENT MANAGEMENT>

<REPLACEMENT-COMPONENT MANAGEMENT>
<ELECTRICAL CAD>
<COMPONENT IDENTIFIER>a12345-0002</COMPONENT IDENTIFIER>
<SHAPE LIBRARY NAME>AA1234</SHAPE LIBRARY NAME>
</ELECTRICAL CAD.>
<MECHANICAL CAD>
<CAD1>
<COMPONENT IDENTIFIER>AB12345-0002</COMPONENT IDENTIFIER>
</CAD1>
 :
</REPLACEMENT-COMPONENT MANAGEMENT>
 :
```

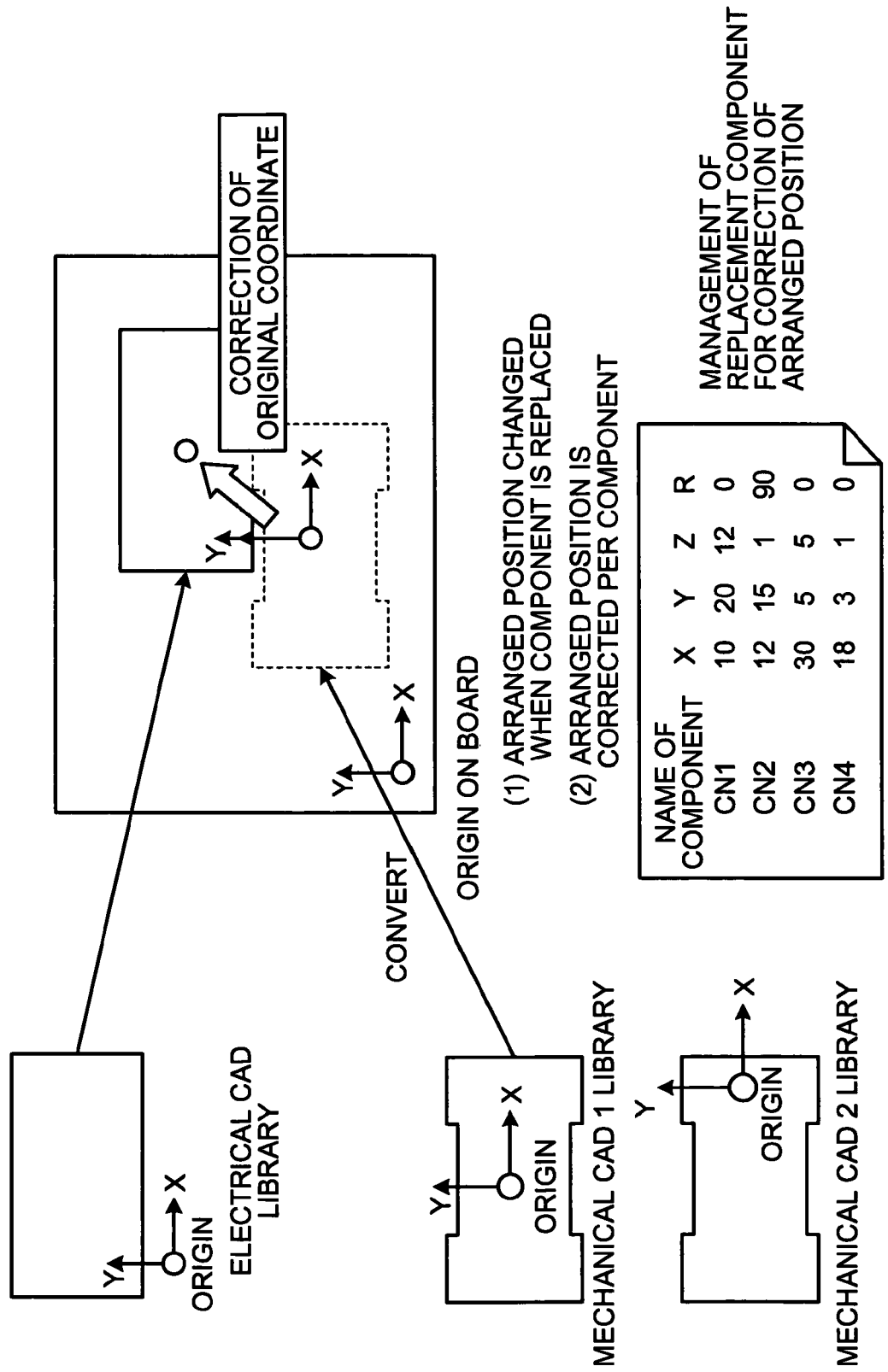

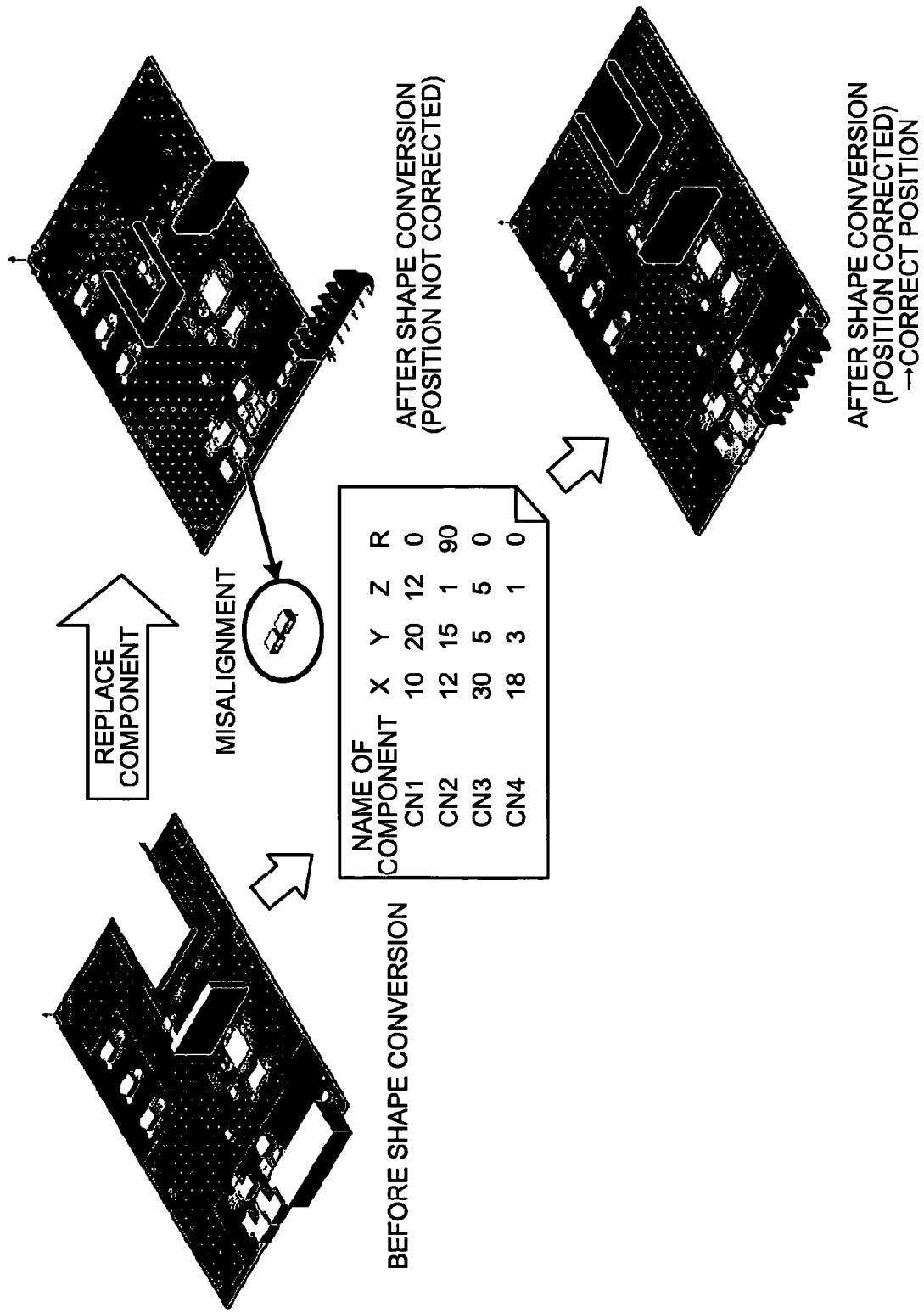

FIG.16
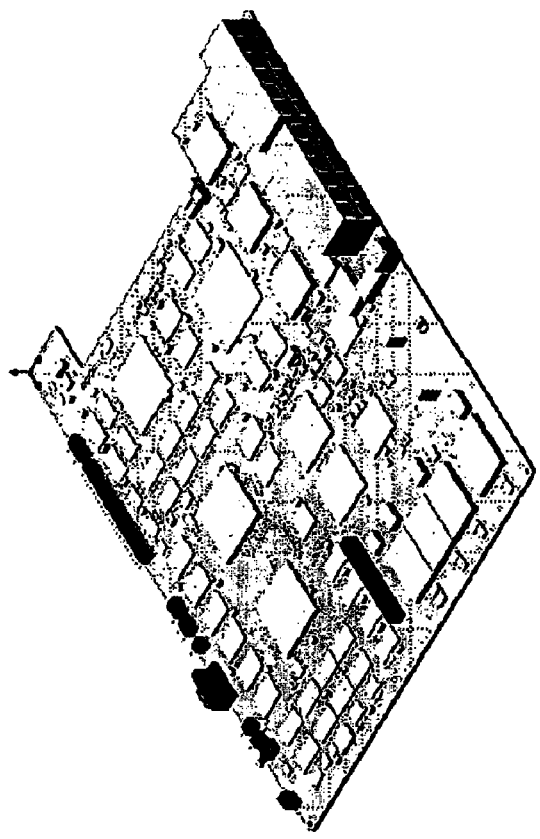
AFTER SHAPE CONVERSION
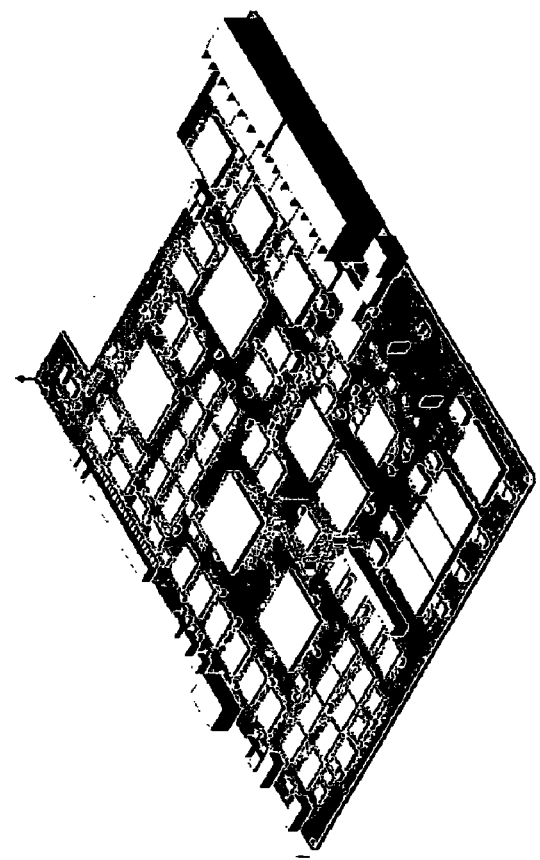
BEFORE SHAPE CONVERSION

HEIGHT-LIMIT CALCULATION APPARATUS, HEIGHT-LIMIT CALCULATION METHOD, METHOD OF MANUFACTURING THREE-DIMENSIONAL STRUCTURE, AND COMPUTER PRODUCT

BACKGROUND OF THE INVENTION

1. Field of the Invention

The present invention relates to a technology for calculating, based on information on a three-dimensional structure including a plurality of partial structures combined and laid out with a space, a height limit for the space.

2. Description of the Related Art

Recently, electrical design using electrical computer-aided design (CAD) and mechanical design using mechanical CAD are performed in parallel for designing an information processing device and the like. The electrical design includes a circuit design on a printed circuit board, and the mechanical design includes a shape design of a chassis and a layout of components.

The electrical design and the mechanical design can be pursued in parallel. However, a shape of the chassis often limits the shape and the layout of electrical components. This repeatedly requires mutual exchange of the information on the electrical design and that on the mechanical design according to the progress of designing. Therefore, a mechanical CAD-electrical CAD collaboration support system has been developed to support information exchange which is required for the electrical design and the mechanical design. For example, Japanese Patent Application Laid-Open No. H11-73434 describes a device that generates information such as a height limit due to the shape of the chassis as component-layout limitation conditions on a printed circuit board, thereby reflecting the result of design by the mechanical CAD in the electrical CAD.

However, the calculation of the height limit based on three-dimensional shape information takes a long time because of a large amount of calculation. In other words, the calculation of the height limit using the three-dimensional shape information needs processes of searching for polygons having an intersection with a normal to the printed circuit board at a measurement point of the height limit inside them from many polygons representing three-dimensional shapes of the device, and from among detected polygons, identifying a polygon having a minimum distance to the measurement point. The information processing device handling several tens of thousands of polygons has such a problem that the calculation requires enormous amount of time (see FIG. 8).

SUMMARY OF THE INVENTION

It is an object of the present invention to at least partially solve the problems in the conventional technology.

According to an aspect of the present invention, a height-limit calculation apparatus that calculates, based on three-dimensional shape information of a three-dimensional structure including a plurality of sub-structures which are laid out and combined with a space, a height limit for the space from a measurement point on a base plane, includes an image creating unit that sets a clip plane at a position of the base plane, sets a view for an image so that a direction of the image is opposite to the base plane and a normal to the base plane represents a depth direction of the image, and creates a three-dimensional image according to the view based on the three-dimensional shape information, and a calculating unit that calculates a height limit by converting the measurement point to a position on screen coordinates of the three-dimensional image and calculating a distance from the measurement point to a three-dimensional shape present at the position based on the three-dimensional shape information.

According to another aspect of the present invention, a height-limit calculation method for calculating, based on three-dimensional shape information of a three-dimensional structure including a plurality of sub-structures which are laid out and combined with a space, a height limit for the space from a measurement point on a base plane, includes setting a clip plane at a position of the base plane, setting a view for an image so that a direction of the image is opposite to the base plane and a normal to the base plane represents a depth direction of the image, creating a three-dimensional image according to the view based on the three-dimensional shape information, and calculating a height limit by converting the measurement point to a position on screen coordinates of the three-dimensional image and calculating a distance from the measurement point to a three-dimensional shape present at the position based on the three-dimensional shape information.

According to still another aspect of the present invention, a method of manufacturing a three-dimensional structure that includes a plurality of sub-structures laid out and combined with a space, in which a height limit is calculated for the space from a measurement point on a base plane by a height-limit calculation apparatus based on three-dimensional shape information, includes setting a clip plane at a position of the base plane, setting a view for an image so that a direction of the image is opposite to the base plane and a normal to the base plane represents a depth direction of the image, creating a three-dimensional image according to the view based on the three-dimensional shape information, and calculating a height limit by converting the measurement point to a position on screen coordinates of the three-dimensional image and calculating a distance from the measurement point to a three-dimensional shape present at the position based on the three-dimensional shape information.

According to still another aspect of the present invention, a computer-readable recording medium stores therein a computer program that causes a computer to implement the above method.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a schematic of a mechanical CAD-electrical CAD collaboration system according to an embodiment of the present invention;

FIG. 2 is a functional block diagram of a height-limited-area-information creating device shown in FIG. 1;

FIGS. 3A to 3F are schematics for explaining the outline of the operation of the height-limited-area-information creating device;

FIGS. 6A to 6F are schematics for explaining a maximum-height calculation process.

FIG. 12 is an example of replacement-component information managed by a replacement-component managing unit shown in FIG. 11.

FIG. 13 is a schematic for explaining how to correct coordinates by a coordinate correcting unit shown in FIG. 11.

FIG. 14 is a schematic for explaining effect of coordinate correction.

FIG. 16 is an example of how the shape is detailed by the shape detailing device.

DETAILED DESCRIPTION OF THE PREFERRED EMBODIMENTS

Figure 4:
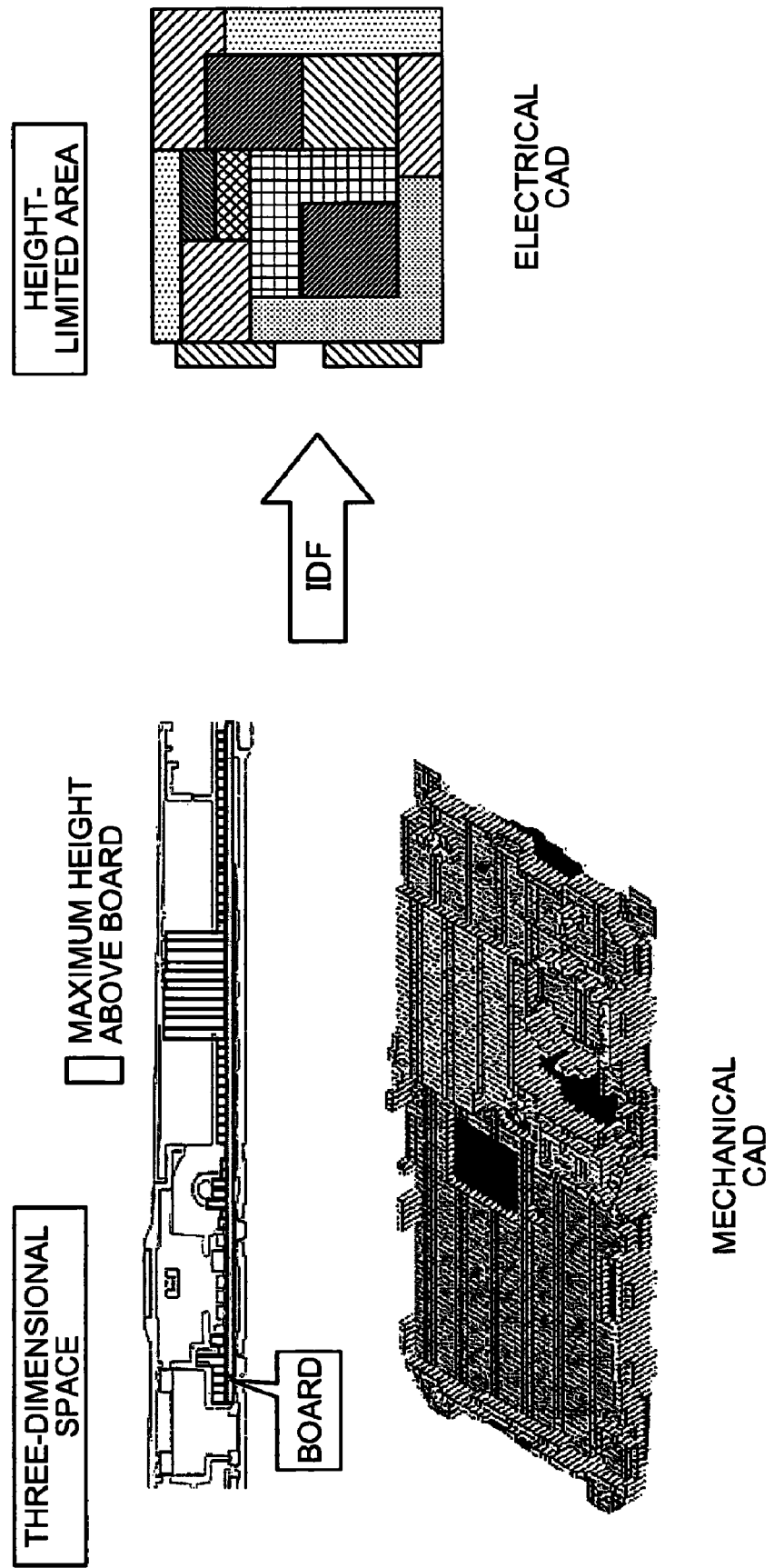
FIG. 4 is an image of how height-limited-area information based on calculation of a height limit is output.

Exemplary embodiments of the present invention are explained in detail below with reference to the accompanying drawings. It is noted that file formats such as Intermediate Data Format (IDF) and Extensible Markup Language (XML) cited in the embodiments are only examples, and any other file formats can be used. The polygon indicates a set of triangles in the embodiments, but any polygon other than the triangle is applicable.

FIG. 1 is a schematic of a mechanical CAD-electrical CAD collaboration system according to an embodiment of the present invention. The mechanical CAD-electrical CAD collaboration system includes a mechanical CAD machine 10, an electrical CAD machine 20, a board-information creating device 30, a height-limited-area-information creating device 100, and a shape detailing device 200.

The mechanical CAD machine 10 manages three-dimensional model data for a chassis and components of an information processing device and the like, and supports mechanical design. The electrical CAD machine 20 manages information on a printed circuit board and electrical components and supports electrical design. The board-information creating device 30 is a mechanical CAD-electrical CAD collaboration support device that creates information on an outline of the printed circuit board and layout of the components thereon based on the three-dimensional model data managed by the mechanical CAD machine 10, and outputs the information in an IDF format. The IDF is used to mutually exchange information between the mechanical CAD and the electrical CAD.

The height-limited-area-information creating device 100 is a mechanical CAD-electrical CAD collaboration support device that creates information for a height limit on a clearance space formed between the printed circuit board and the chassis or another printed circuit board using the three-dimensional model data managed by the mechanical CAD machine 10.

The shape detailing device 200 is a mechanical CAD-electrical CAD collaboration support device that details shape information (2.5-dimension) of the electrical component managed by the electrical CAD machine 20 to convert it into three-dimensional shape information. Mathematical Library (MLIB) used by the shape detailing device 200 is a file that defines a correspondence between electrical CAD components and mechanical CAD components used to replace the shape information for the electrical components with the three-dimensional shape information.

The shape detailing device 200 details the shape information for the electrical components, and the mechanical CAD machine 10 can thereby manage more precise three-dimensional models, and the board-information creating device 30 and the height-limited-area-information creating device 100 can thereby create more precise information. As a file format to mutually exchange the respective information for the mechanical CAD and the electrical CAD, the IDF is used here, but any other file format can also be used. The height-limited-area-information creating device 100 and the shape detailing device 200 are explained in detail below.

The configuration of the height-limited-area-information creating device 100 is explained first. FIG. 2 is a functional block diagram of the height-limited-area-information creating device 100. The height-limited-area-information creating device 100 includes a controller 100a that performs processes required to create height-limited-area information, and a storing unit 100b that stores therein information required to create the height-limited-area information.

The controller 100a includes a three-dimensional-shape input unit 110, a three-dimensional-shape display unit 120, a parameter receiving unit 130, a calculation-basis determining unit 140, an area dividing unit 150, a maximum-height calculating unit 160, a same-level-area creating unit 170, a coordinate converting unit 180, and a height-limited-area-information output unit 190.

The three-dimensional-shape input unit 110 reads three-dimensional model data for a device including the printed circuit board and writes the data as three-dimensional model data 101 to the storing unit 100b. The three-dimensional model data 101 contains a three-dimensional shape, position and posture information, and information such as name and attribute of the chassis and the components. The three-dimensional shape is expressed by a set of polygons, i.e., triangles.

The three-dimensional-shape display unit 120 displays a three-dimensional shape on a display device using the three-dimensional model data 101 written into the storing unit 100b by the three-dimensional-shape input unit 110.

The parameter receiving unit 130 receives parameters, from a user, such as a plane of the printed circuit board which is a basis to calculate the height limit, a size of an area which is a unit to calculate the height limit, and an allowable value to determine a height as the uniform height, and writes the parameters as parameter information 102 to the storing unit 100b.

The calculation-basis determining unit 140 determines whether the printed circuit board has different levels, and, when the printed circuit board has the different levels, determines whether the height limit is to be calculated based on a plurality of levels or a single level. The calculation-basis determining unit 140 removes the components mounted on the printed circuit board when the height limit is to be calculated based on a single level. More specifically, the calculation-basis determining unit 140 removes the components mounted thereon, when the printed circuit board has the different levels as in the case where the components mounted on the printed circuit board are integrally formed with the printed circuit board as a part of the printed circuit board, and also where the printed circuit board without the components mounted thereon is used as the base plane (when calculation is performed based on the single level).

The calculation-basis determining unit 140 removes the components mounted on the printed circuit board when the printed circuit board has the different levels and one of the levels is used as the base plane to calculate the height limit. This allows the height-limited-area-information creating device 100 to calculate the height limit even for the case of the printed circuit board with the components mounted thereon, from the height of the printed circuit board itself before the components are mounted thereon. When the height limit is to be calculated, the user can determine whether to use the printed circuit board with the components mounted thereon or the printed circuit board before the components are mounted thereon as the basis.

The area dividing unit 150 uniformly divides an area of the printed circuit board used to calculate the height limit, into unit areas, and writes information for coordinates of the unit areas obtained through division, as area information 103, into the storing unit 100b. The area dividing unit 150 divides the area of the printed circuit board into areas each having a size specified by a parameter as the size of an area being a unit to calculate the height limit. The unit area to calculate the height limit is a rectangle, and the size of the unit area is specified by lengths in height and width of the rectangle.

When the height of the printed circuit board based on which the height limit is calculated varies depending on locations, i.e., when the height limit is calculated based on the printed circuit board including the components mounted thereon, the area dividing unit 150 uniformly divides the area for each face with the uniform height. While the area of the printed circuit board to calculate the height limit is uniformly divided herein, the area is not necessarily uniformly divided.

The maximum-height calculating unit 160 calculates the maximum height of a clearance space for each unit area obtained through division by the area dividing unit 150, and adds a calculated value to the area information 103. The maximum-height calculating unit 160 calculates each height of a clearance space with respect to four vertices of a rectangle, and determines the minimum value of four heights as the maximum height of the unit area. In this case, each height of the clearance space with respect to the four vertices of the rectangle is calculated to determine the maximum height of the unit area, but any other methods can also be used to determine the maximum height of the unit area by calculating each height of the clearance space with respect to, for example, the central point of the rectangle to determine the height as the maximum height of the unit area.

The same-level-area creating unit 170 creates an area with a uniform height using the maximum heights obtained through calculation for each unit area by the maximum-height calculating unit 160, and adds information for the area with the uniform height to the area information 103. The same-level-area creating unit 170 determines the height within the allowable value received by the parameter receiving unit 130 as the uniform height, and creates an area with the uniform height.

The coordinate converting unit 180 converts a coordinate system of the mechanical CAD machine 10 to that of the electrical CAD machine 20 stored in the storing unit 100b. The coordinate converting unit 180 converts the coordinate system when the user specifies the coordinate system of the electrical CAD machine 20.

The height-limited-area-information output unit 190 creates height-limited-area information based on the area information 103 in which the coordinate conversion is performed by the coordinate converting unit 180, and outputs the information in the IDF format.

The process procedure of the height-limited-area-information creating device 100 is explained below with reference to FIGS. 3A to 5. FIGS. 3A to 3F are schematics for explaining the outline of processes of the height-limited-area-information creating device 100. As shown in FIG. 3A, the case where the height-limited-area-information creating device 100 calculates a height limit from one of planes of the printed circuit board being the reference to a case or a cover with its free-form inner wall, is explained below.

FIG. 3B depicts the printed circuit board with a single level and the printed circuit board with different heights in different positions thereof. FIG. 3C depicts a case where a single basis is used and a case where a plurality of bases is used to calculate the height limit when the height of the printed circuit board is different depending on the locations.

FIG. 3D is a schematic for explaining division of the printed circuit board into uniform areas by the height-limited-area-information creating device 100. FIG. 3E is a schematic for explaining calculation of the height limit for each unit area obtained through the division. In this manner, by dividing the printed circuit board into the uniform areas and calculating the height limit for each unit area obtained through division, it is possible to stably calculate even a case or a cover which has in many cases a free-form shape. The calculation of the height limit with the single basis is shown here as an example.

FIG. 3F depicts the result of calculating the height limit. FIG. 4 is an image of how the height-limited-area information obtained based on the result of calculating the height limit is output. The height-limited-area information is output in the IDF format so as to be readable by the electrical CAD machine 20.

Figure 5:
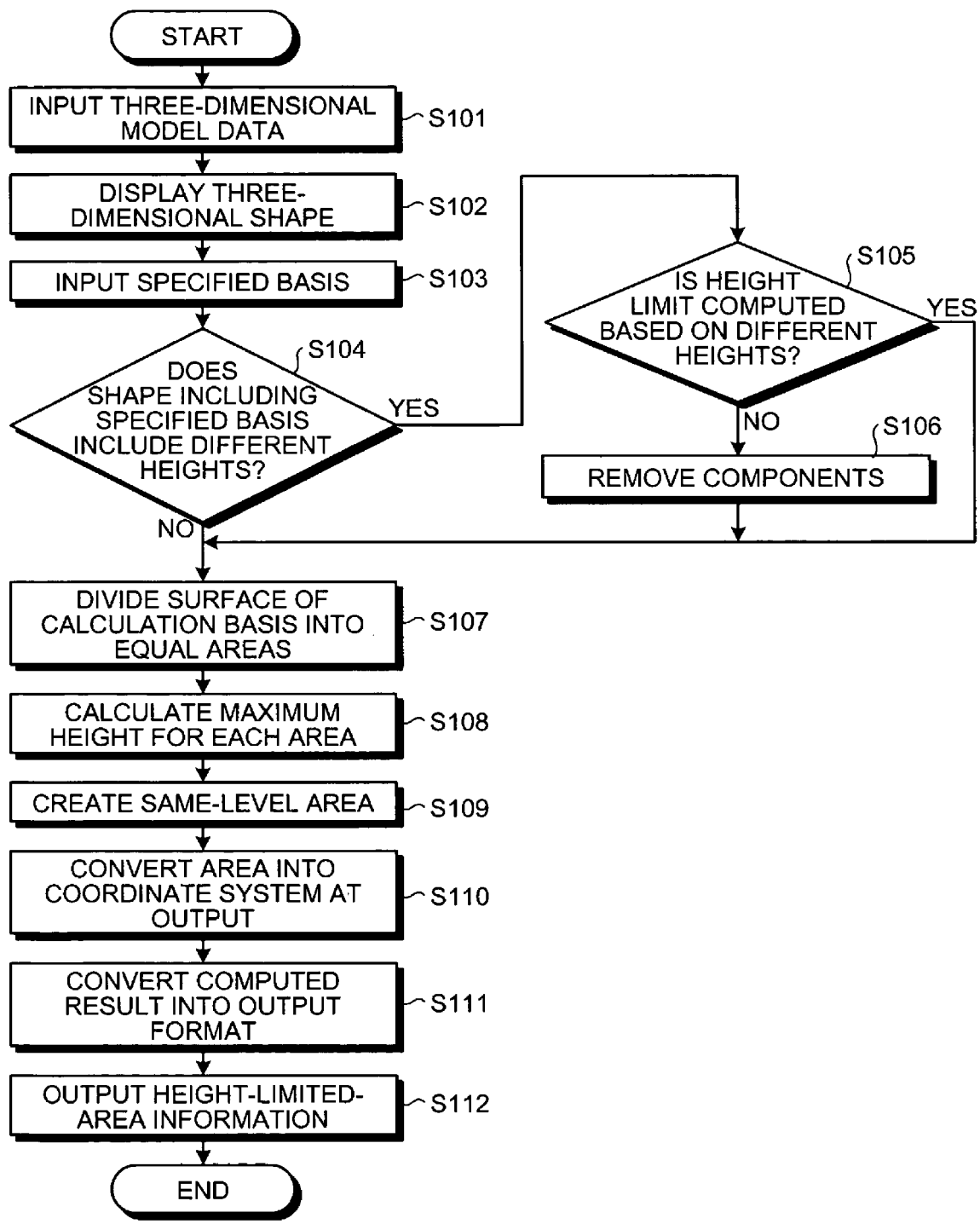
FIG. 5 is a flowchart of the operation of the height-limited-area-information creating device.

FIG. 5 is a flowchart of the operation of the height-limited-area-information creating device 100. In the height-limited-area-information creating device 100, the three-dimensional-shape input unit 110 receives three-dimensional model data (step S101), and writes the data to the storing unit 100b as the three-dimensional model data 101.

The three-dimensional-shape display unit 120 reads the three-dimensional model-data 101 and displays the three-dimensional shape (step S102), and the parameter receiving unit 130 receives parameters such as a specified basis (plane of the printed circuit board) specified by the user as a height-limit calculation basis for the displayed three-dimensional shape (step S103), and writes the parameters as the parameter information 102 into the storing unit 100b.

The calculation-basis determining unit 140 determines whether the specified basis has different levels (step S104). When the specified basis has the different levels, the calculation-basis determining unit 140 determines, based on setting information, whether the height limit is to be calculated based on the different levels (step S105). When the height limit is calculated based on the single level, the calculation-basis determining unit 140 removes the components mounted on the specified basis (step S106).

The area dividing unit 150 equally divides the base plane based on which the height limit is calculated (step S107), and the maximum-height calculating unit 160 calculates the maximum height of each of the uniform areas (step S108). Then, the same-level-area creating unit 170 creates an area with the uniform height using the allowable value of the parameter information 102 (step S109), and the coordinate converting unit 180 converts the area information 103 to the coordinate system used for the output (step S110). The height-limited-area-information output unit 190 converts the result of calculating the height limit, to IDF being an output format (step S111), and outputs the IDF as the height-limited-area information (step S112).

In this manner, the calculation-basis determining unit 140 determines whether the specified basis has different levels. When the specified basis has the different levels, the calculation-basis determining unit 140 further determines, based on the setting information, whether the height limit is calculated based on the different levels. With this operation, when the components are mounted on the printed circuit board as the basis, the calculation-basis determining unit 140 can select either one of the height limit calculated from the printed circuit board with the component mounted thereon and the height limit calculated from the printed circuit board without components mounted thereon according to the setting.

Figure 6A:
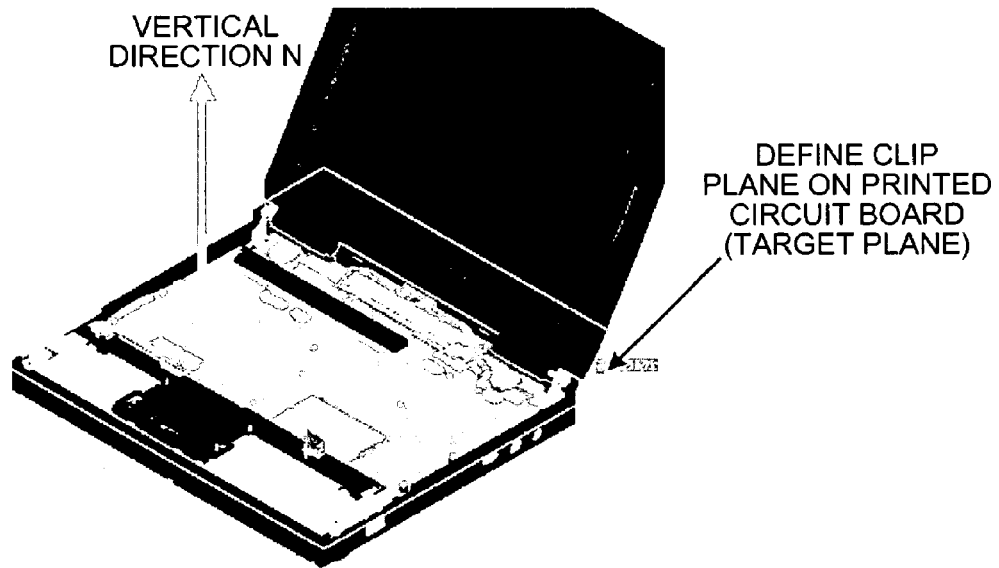

A maximum-height calculation process by the maximum-height calculating unit 160 is explained in detail below with reference to FIGS. 6A to 9. FIGS. 6A to 6F are schematics for explaining the maximum-height calculation process. As shown in FIG. 6A, in the maximum-height calculation process, the maximum-height calculating unit 160 defines a clip plane for three-dimensional image processing on the base plane which is a basis to calculate the maximum height.

Figure 6B:
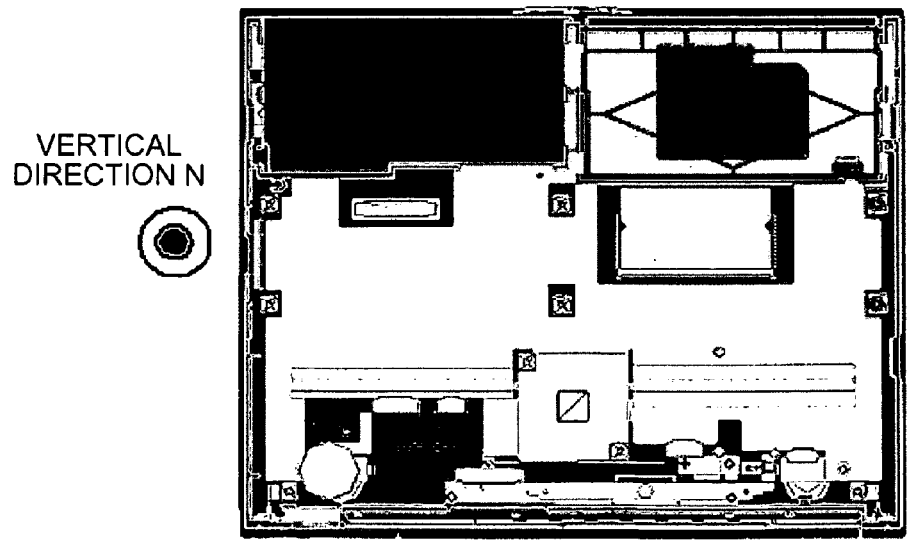
Figure 6C:
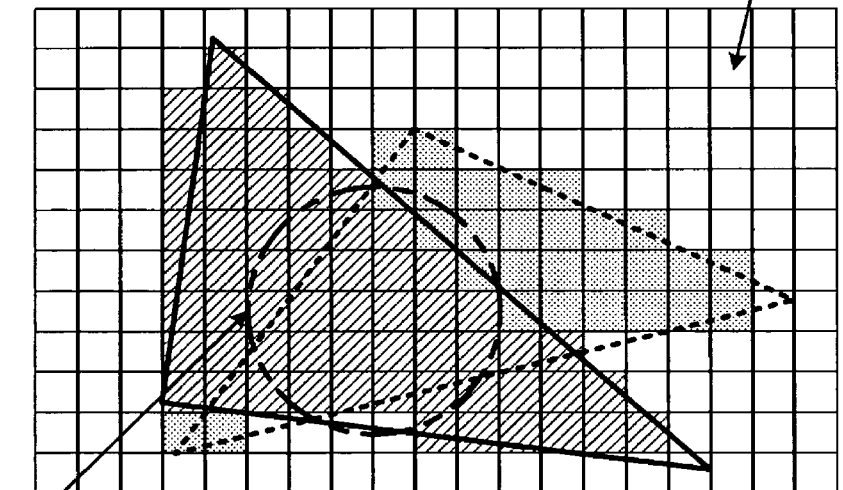
Figure 6D:
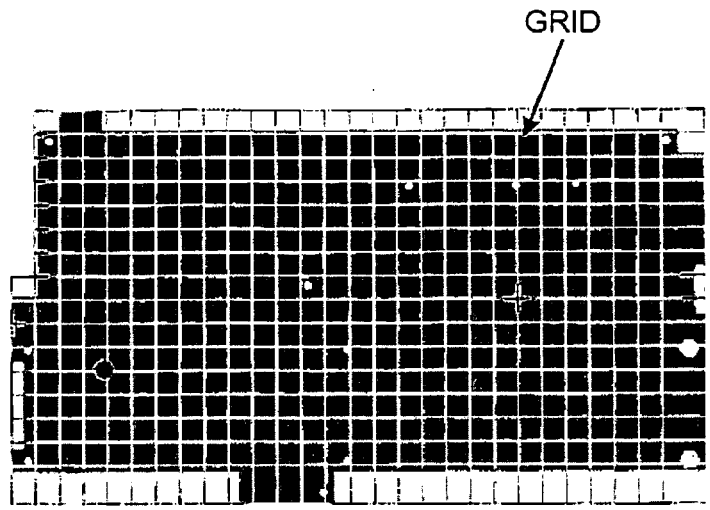

As shown in FIG. 6B, the vertical direction N of the clip plane is directed toward the upward direction of the screen, to create an image A displaying a cross-section of the three-dimensional model at the clip plane by the three-dimensional image processing. The image A is formed within a frame buffer. As shown in FIG. 6C, pixels of a polygon (solid line) which is located frontward with respect to the printed circuit board as the basis are drawn in the image A.

Figure 6E:
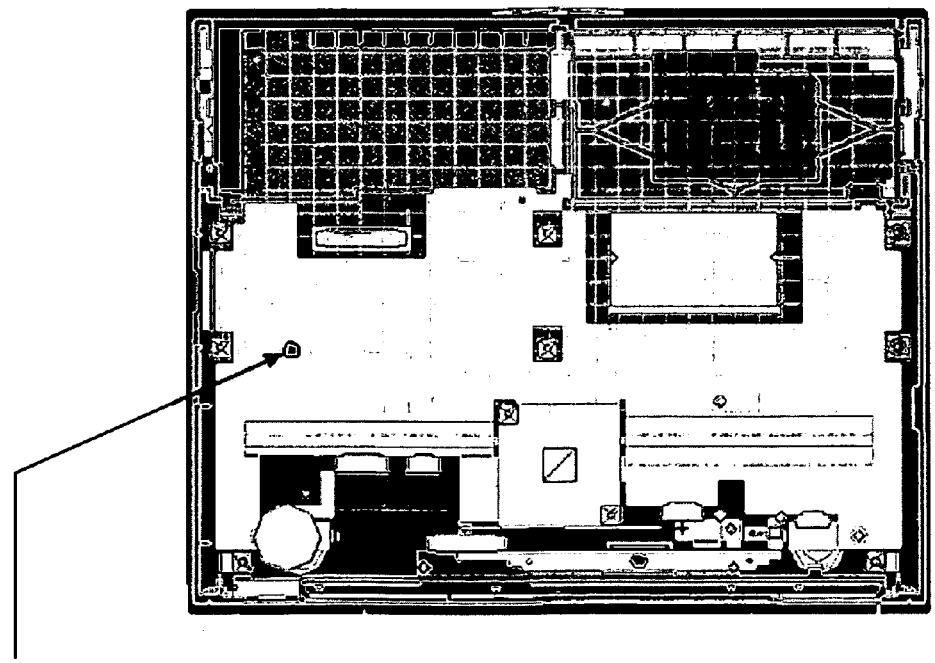

Vertexes of each unit area that divides the printed circuit board (a grid shown in FIG. 6D) are converted from three-dimensional coordinates into two-dimensional coordinates on the image A, polygon information of corresponding pixels is acquired, and a distance from each vertex to the polygon is calculated as a height for the vertex (FIG. 6E). Each height is calculated for four vertices of the grid, and a minimum value of the four heights is determined as a maximum height for the grid. It is also possible to calculate a height at the center of the grid and determine the height as the maximum height, instead of calculation of the heights of the four vertices. FIG. 6F depicts the area with the uniform height created by the same-level-area creating unit 170 based on maximum heights calculated by the maximum-height calculating unit 160.

Figure 7:
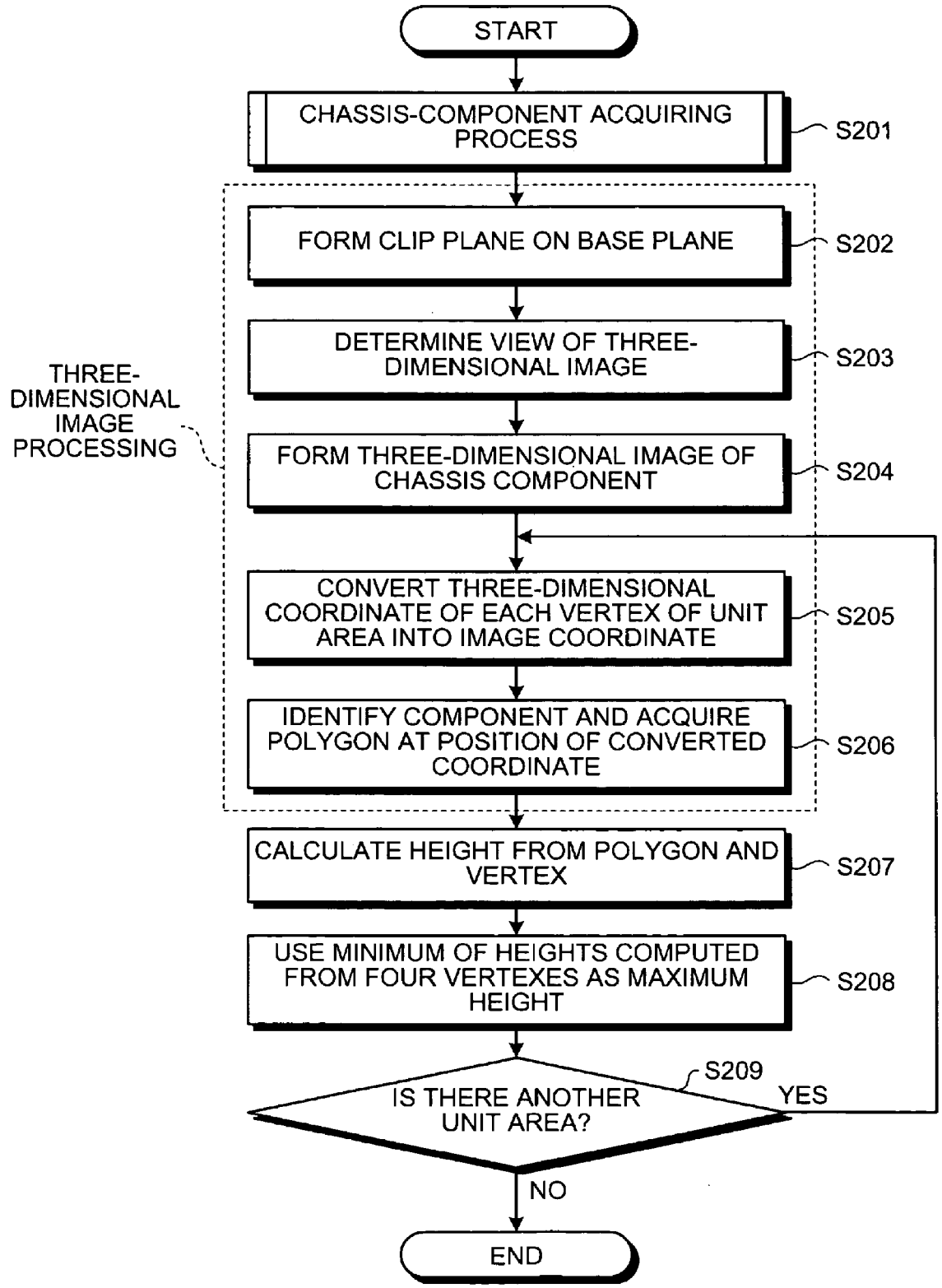
FIG. 7 is a flowchart of the operation of a maximum-height calculating unit shown in FIG. 2.

FIG. 7 is a flowchart of the maximum-height calculation process performed by the maximum-height calculating unit 160. The maximum-height calculating unit 160 performs a chassis-component acquiring process to acquire a chassis-side component for which the height from the printed circuit board is to be calculated (step S201).

The maximum-height calculating unit 160 creates a clip plane at a position on the base plane of the printed circuit board based on which the height is calculated (step S202), and sets a view so that the orientation of an image is opposite to the base plane and a normal to the base plane corresponds to the depth direction of the image (step S203). The maximum-height calculating unit 160 creates a three-dimensional image of the chassis-side component according to the set view (step S204).

The maximum-height calculating unit 160 selects one of the unit areas obtained through division of the base plane by the area dividing unit 150, converts the coordinates of each vertex of the selected unit area to screen coordinates (step S205), and acquires a component and a polygon at the position of the converted coordinates (step S206). The processes at step S202 to step S206 can be performed by the three-dimensional image processing.

The maximum-height calculating unit 160 calculates a distance from the vertex to the polygon as a height (step S207), determines the minimum value among the heights calculated from the four vertices as the maximum height for the unit area, and adds the maximum height to the area information 103 (step S208). The maximum-height calculating unit 160 determines whether there is a next unit area (step S209). When there is the next unit area, the process returns to step S205, and when there is no next unit area, the process ends.

The maximum-height calculating unit 160 acquires the polygon which is an object for the height limit on each vertex in the unit area using the three-dimensional image processing in the above manner. This allows calculation of the maximum height at higher speed, as compared with the case where it is determined whether there is an intersection of a normal from a vertex with a polygon inside the polygon to acquire a polygon being an object for the calculation.

Figure 8:
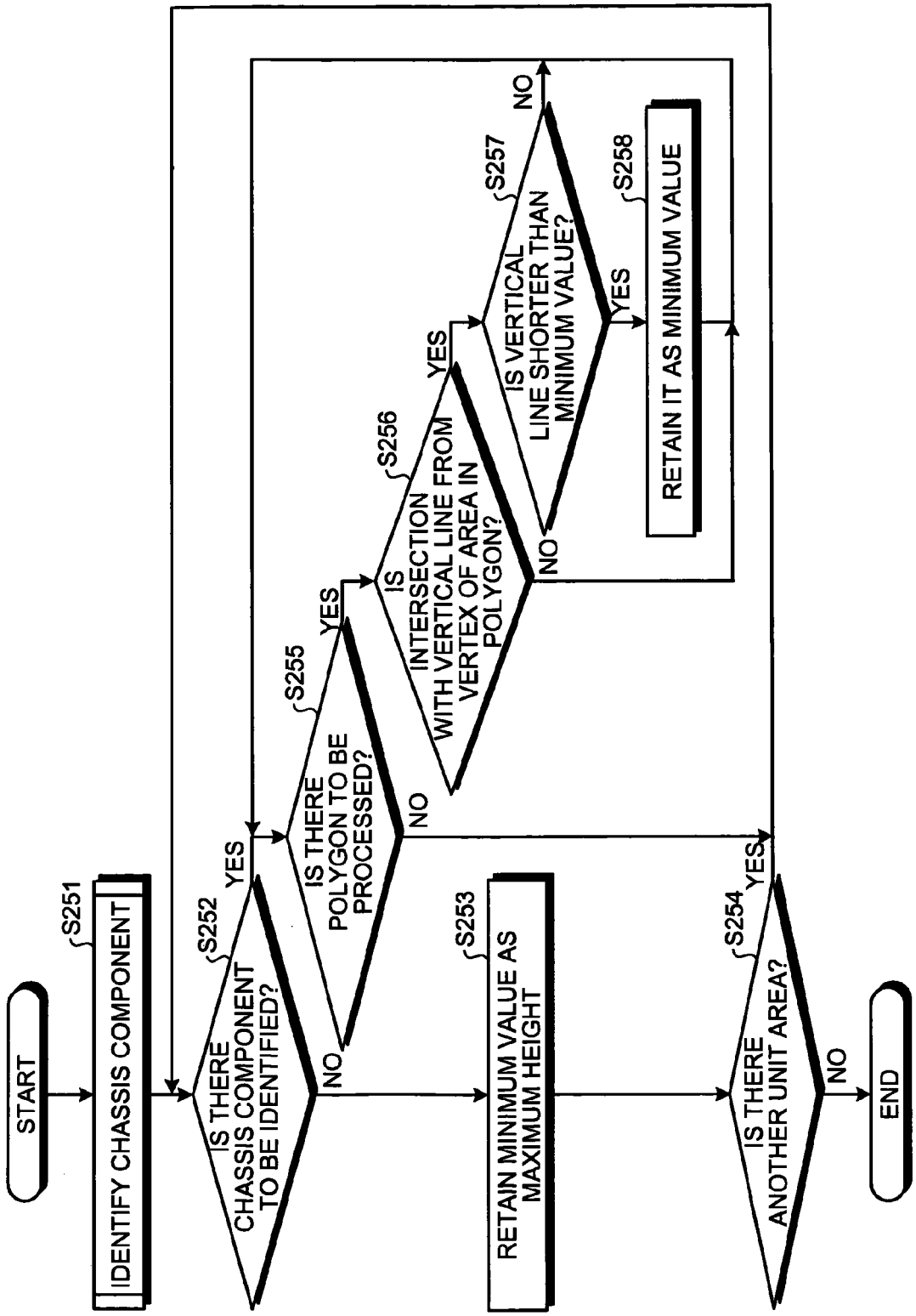
FIG. 8 is a flowchart of the process of calculating a maximum height based on an intersection of a normal from a vertex and a polygon.

For comparison, a flowchart of another maximum-height calculation process is shown in FIG. 8, in which it is determined whether there is an intersection of a normal from a vertex and a polygon inside the polygon to acquire a polygon as the object. It is noted that the maximum height of one vertex is calculated here for each unit area.

In the maximum-height calculation process, a chassis-side component for which the height from the printed circuit board is to be calculated is identified (step S251) It is determined whether there is any chassis-side component as an object (step S252). When there are chassis-side components, one of the chassis-side components is selected, and it is determined whether there is a polygon expressing the chassis-side component, i.e., a polygon to be processed (step S255).

If there are polygons, then one of the polygons is selected to determine whether there is an intersection with the normal from the vertex of the area inside the polygon (step S256). As a result, when there is the intersection inside the polygon, it is determined whether the length of the normal is longer than a value stored as the minimum value (step S257). It is noted that the maximum value of an assumed height limit is initialized for the minimum value. If the length of the normal is smaller than the minimum value, then the length of the normal is stored as the minimum value (step S258), and the process returns to step S255. On the other hand, if the length of the normal is not smaller than the minimum value and when there is no intersection inside the polygon, the process returns to step S255 without updating the minimum value. But, when there is no polygon, the process returns to step S252.

When there is no chassis-side component, this indicates the case where the maximum height for one unit area is calculated. Therefore, the minimum value is stored as the maximum height of the unit area (step S253), and it is further determined whether there is a next unit area (step S254). When there is the next unit area, the process returns to step S252, where the calculation for the next unit area is performed, while when there is no unit area, the process ends.

As explained above, in the maximum-height calculation process, it is necessary to check all the polygons of all the chassis-side components as to whether the intersection with the normal is included in each of the polygons. Thus, an extremely long time is required for the calculation in such a device that handles hundreds of thousands of polygons.

Figure 9:
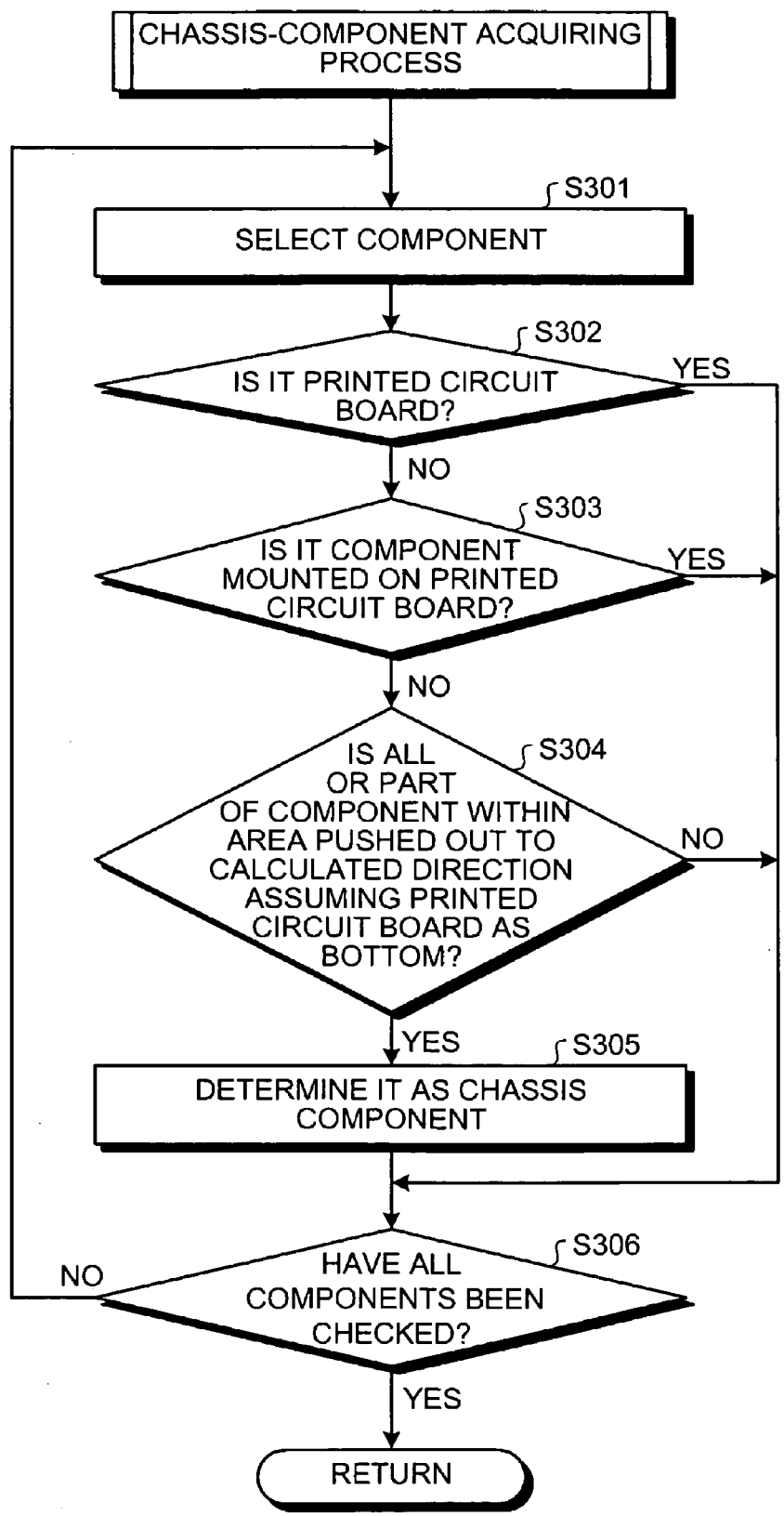
FIG. 9 is a detailed flowchart of a chassis-component acquiring process shown in FIG. 7.

FIG. 9 is a detailed flowchart of the chassis-component acquiring process. In the chassis-component acquiring process, the maximum-height calculating unit 160 selects one of components for which data as the three-dimensional model data 101 is stored (step S301), and determines whether the selected component is the printed circuit board (step S302).

When the selected component is the printed circuit board, the selected component is not the chassis-side component, and hence, the process proceeds to step S306. When the selected component is not the printed circuit board, it is determined whether the selected component is a component mounted on the printed circuit board (step S303).

When the selected component is the component mounted on the printed circuit board, the selected component is not the chassis-side component, and hence, the process proceeds to step S306. When the selected component is not the component mounted thereon, it is further determined whether all the selected components or at least a part of them exist in an area surrounded in such a manner that the base plane of the printed circuit board is defined as its bottom face and a direction in which the height limit is calculated is determined as its height direction (step S304).

When the selected component is outside the area, the selected component is not an object whose maximum height is calculated, and the process proceeds to step S306. When the selected component is in the area, the selected component is determined as a chassis-side component (step S305). It is further determined whether all the components have been checked (step S306). When there is any component which is not checked, the process returns to step S301. When all the components have been checked, the process ends.

In this manner, the maximum-height calculating unit 160 acquires the chassis-side component and removes any component other than this, and it is thereby possible to efficiently calculate the maximum height.

Figure 10:
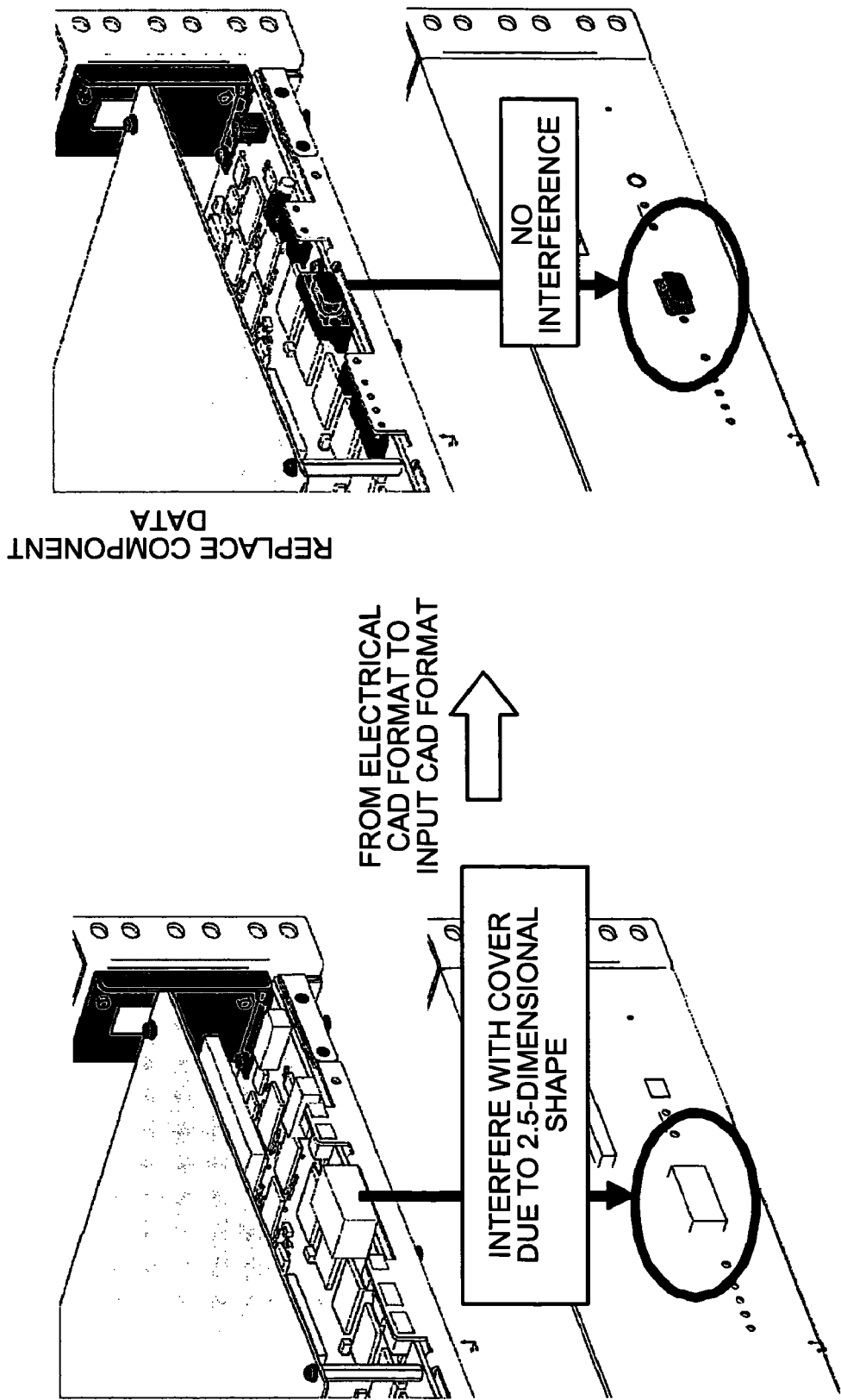
FIG. 10 is a schematic for explaining a shape-detailing process performed by a shape detailing device shown in FIG. 1.

FIG. 10 is a schematic for explaining shape refining by the shape detailing device 200. In the electrical CAD, because the shape of a component is represented in 2.5-dimensionally, when the mechanical CAD uses shape data for the electrical CAD, the some component may interfere with the cover which does not originally interfere therewith.

On the other hand, when component data is converted to three-dimensional data for the mechanical CAD by the shape detailing device 200, the mechanical CAD can check the interference using precise shapes. Therefore, the interference between components can accurately be checked.

When an electrical component is mounted on the printed circuit board, by using the precise shape data for the components in the mechanical CAD, more precise shape data can be transferred to the height-limited-area-information creating device 100. As a result, the height-limited-area-information creating device 100 can create more precise height-limited-area information.

Figure 11:
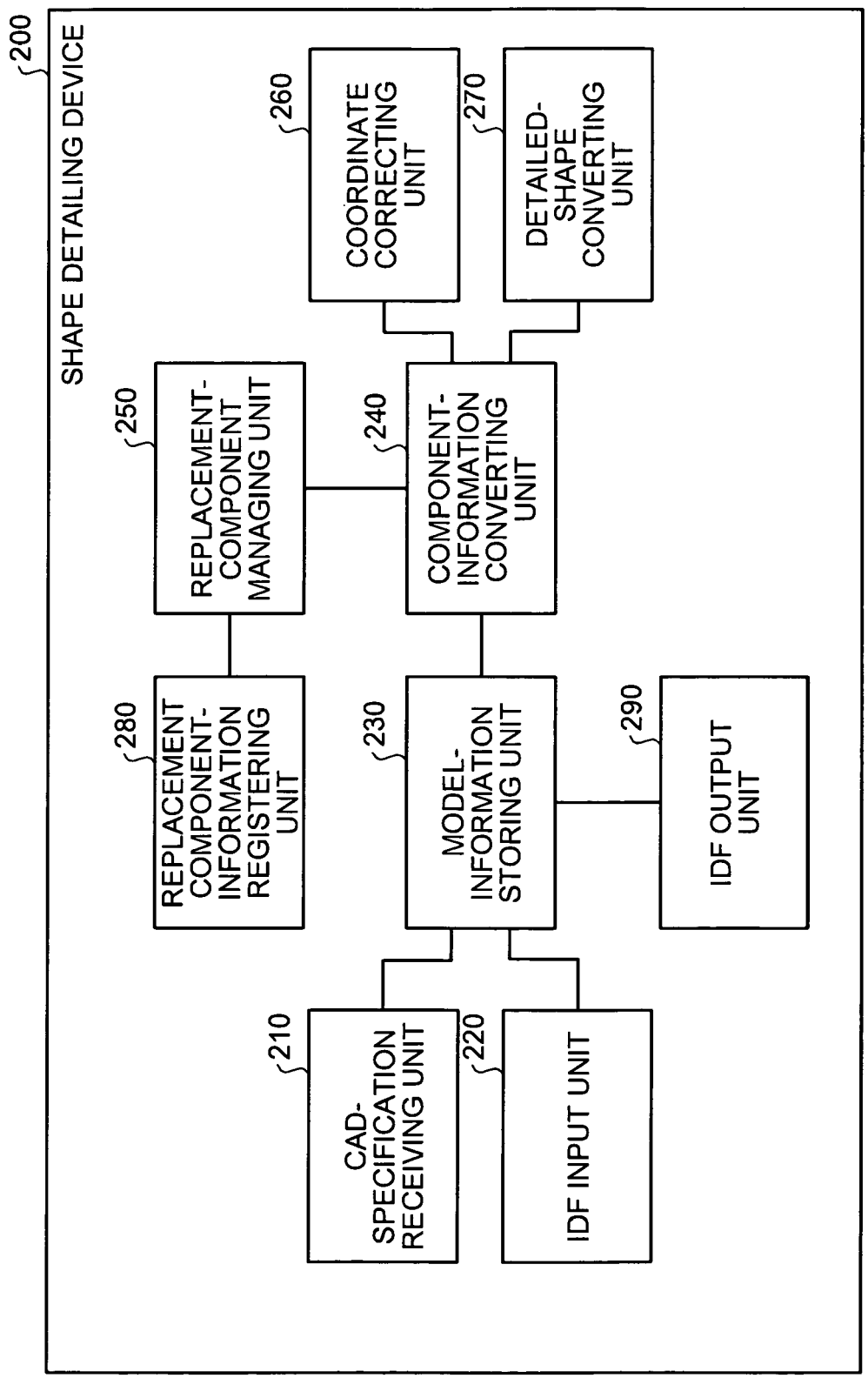
FIG. 11 is a functional block diagram of the shape detailing device.

FIG. 11 is a functional block diagram of the shape detailing device 200. The shape detailing device 200 includes a CAD-specification receiving unit 210, an IDF input unit 220, a model-information storing unit 230, a component-information converting unit 240, a replacement-component managing unit 250, a coordinate correcting unit 260, a detailed-shape converting unit 270, a replacement-component-information registering unit 280, and an IDF output unit 290.

The CAD-specification receiving unit 210 receives specifications of a mechanical CAD and an electrical CAD which are to be linked to each other, from the user. More specifically, the CAD-specification receiving unit 210 receives a mechanical CAD name, an IDF file name created by the electrical CAD, and the like.

The IDF input unit 220 reads the IDF whose file name is received by the CAD-specification receiving unit 210, and stores model information created by the electrical CAD in the model-information storing unit 230.

The model-information storing unit 230 stores therein the model information created by the electrical CAD. The model-information storing unit 230 also stores therein the information received by the CAD-specification receiving unit 210.

The component-information converting unit 240 reads the model information created by the electrical CAD from the model-information storing unit 230, and replaces the component information for the electrical CAD with the component information for the mechanical CAD using the replacement-component information managed by the replacement-component managing unit 250, and writes the replaced information to the model-information storing unit 230. More specifically, the shape information and coordinates of a component are replaced with those for the mechanical CAD.

The component-information converting unit 240 replaces the shape information and coordinates for the electrical CAD of the component information with those for the mechanical CAD, and the mechanical CAD machine 10 can thereby highly accurately check interference, and the height-limited-area-information creating device 100 can create high-precision height-limit information.

The replacement-component managing unit 250 stores therein the component information for the electrical CAD and the component information for the mechanical CAD for the same component associated with each other. FIG. 12 is an example of the replacement-component information managed by the replacement-component managing unit 250. The replacement-component information is described in an XML format, and a correspondence between the information for the electrical CAD and the information for the mechanical CAD is defined, for each component, by <replacement-component management> to </replacement-component management>.

The information for the electrical CAD is defined by <electrical CAD> to </electrical CAD>. As the information for the electrical CAD, a component number is defined by <component identification name> to </component identification name>, and a component-shape type name is defined by <shape library name> to </shape library name>.

The information for the mechanical CAD is defined by <mechanical CAD> to </mechanical CAD>, a component number is defined by <component identification name> to </component identification name>, and a difference in coordinates is defined by <coordinate difference> to </coordinate difference>. As for the information for the mechanical CAD, to be accessible to a plurality of mechanical CADs, the component information specific to each mechanical CAD is defined as a CAD-specific reflection such as <CAD 1> to </CAD 1>, <CAD 2> to </CAD 2>, . . . for each mechanical CAD, while the component information common to mechanical CADs is directly defined by <mechanical CAD> to </mechanical CAD>. It is noted that as a difference in coordinates, each difference in X coordinate, Y coordinate, Z coordinate, and rotating coordinate is defined by <coordinate difference> to </coordinate difference>.

In the example shown in FIG. 12, a component whose component number is "A12345-0001" in the electrical CAD is associated with a component whose component number is "AB12345-0001" in the mechanical CAD.

Referring back to FIG. 11, the coordinate correcting unit 260 corrects the coordinates of a component to those of the mechanical CAD based on an instruction by the component-information converting unit 240. FIG. 13 is a schematic for explaining how the coordinate correcting unit 260 corrects coordinates. Each origin may sometimes be differently set in an electrical CAD library and each mechanical CAD library. Therefore, if the component information for the electrical CAD is simply replaced with component information for the mechanical CAD, a layout position of the components may be displaced.

The coordinate correcting unit 260 corrects the coordinates using the coordinate differences managed by the replacement-component managing unit 250. In FIG. 13, for component "CN1", for example, an X-coordinate difference "10", a Y-coordinate difference "20", and a Z-coordinate difference and a rotating-coordinate difference "0" are managed by the replacement-component managing unit 250. Consequently, as shown in FIG. 14, the respective components are displayed at the right positions without displacement although the components are displaced and displayed by the mechanical CAD machine 10 when the coordinates are not corrected.

The detailed-shape converting unit 270 replaces the shape information for a component with the shape information for the mechanical CAD based on an instruction by the component-information converting unit 240. In other words, the detailed-shape converting unit 270 replaces 2.5-dimensional shape information in the electrical CAD with three-dimensional detailed shape information in the mechanical CAD.

The replacement-component-information registering unit 280 registers therein the component information for the electrical CAD and the component information for the mechanical CAD associated with each other for the same component based on an instruction of the user. The IDF output unit 290 reads the model information with which the component information is replaced by the component-information converting unit 240, from the model-information storing unit 230, and outputs the model information in the IDF format.

Figure 15:
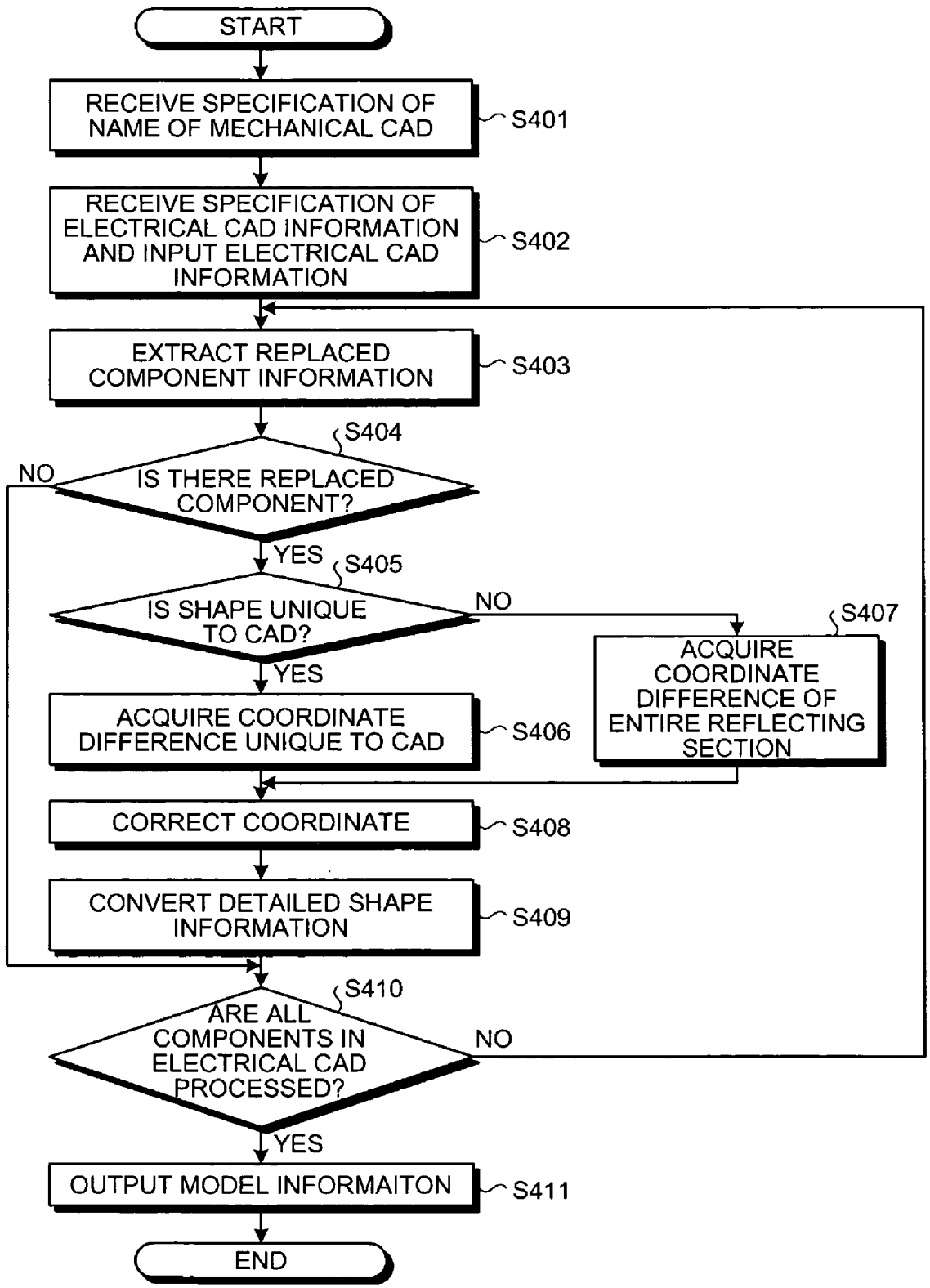
FIG. 15 is a flowchart of the operation of the shape detailing device.

FIG. 15 is a flowchart of the operation of the shape detailing device 200. In the shape detailing device 200, the CAD-specification receiving unit 210 receives a specification of a mechanical CAD name with which the component information is replaced and a specification of electrical CAD information, and the IDF input unit 220 receives the information for the electrical CAD, to store the information in the model-information storing unit 230 (step S401 to step S402).

The component-information converting unit 240 reads the component information from the model-information storing unit 230 one by one, and requests the component information for a corresponding mechanical CAD, i.e., replacement-component information from the replacement-component managing unit 250 to take the component information therefrom (step S403). As a result, when there is no component to be replaced (NO at step S404), the process proceeds to step S410. When there is a component to be replaced (YES at step S404), it is determined whether the shape of the component to be replaced is CAD specific (step S405). When the shape is the CAD specific, a CAD-specific coordinate difference is acquired (step S406). When the shape of the component is not CAD specific, a coordinate difference for a whole reflection is acquired (step S407).

The coordinate correcting unit 260 corrects the coordinates based on the coordinate difference (step S408), and the detailed-shape converting unit 270 replaces the shape information for the electrical CAD with the shape information for the mechanical CAD, i.e., detailed shape information (step S409). The component-information converting unit 240 writes the component information whose coordinates are corrected and with which shape information is replaced, into the model-information storing unit 230, and determines whether all the electrical CAD components have been processed (step S410). When there is any component not yet processed, the process returns to step S403. When all the components have been processed, the IDF output unit 290 outputs the model information for which the component information is replaced, in the IDF format (step S411).

As explained above, the component-information converting unit 240 replaces the component information in the model-information storing unit 230 with the component information for the corresponding mechanical CAD. This allows the mechanical CAD machine 10 to highly precisely check interference, and the height-limited-area-information creating device 100 to create high-precision height-limited-area information.

FIG. 16 is an example of how the shape detailing device 200 details the shape. The shape precision of components mounted on the printed circuit board is different between before and after shape replacement.

Figure 17:
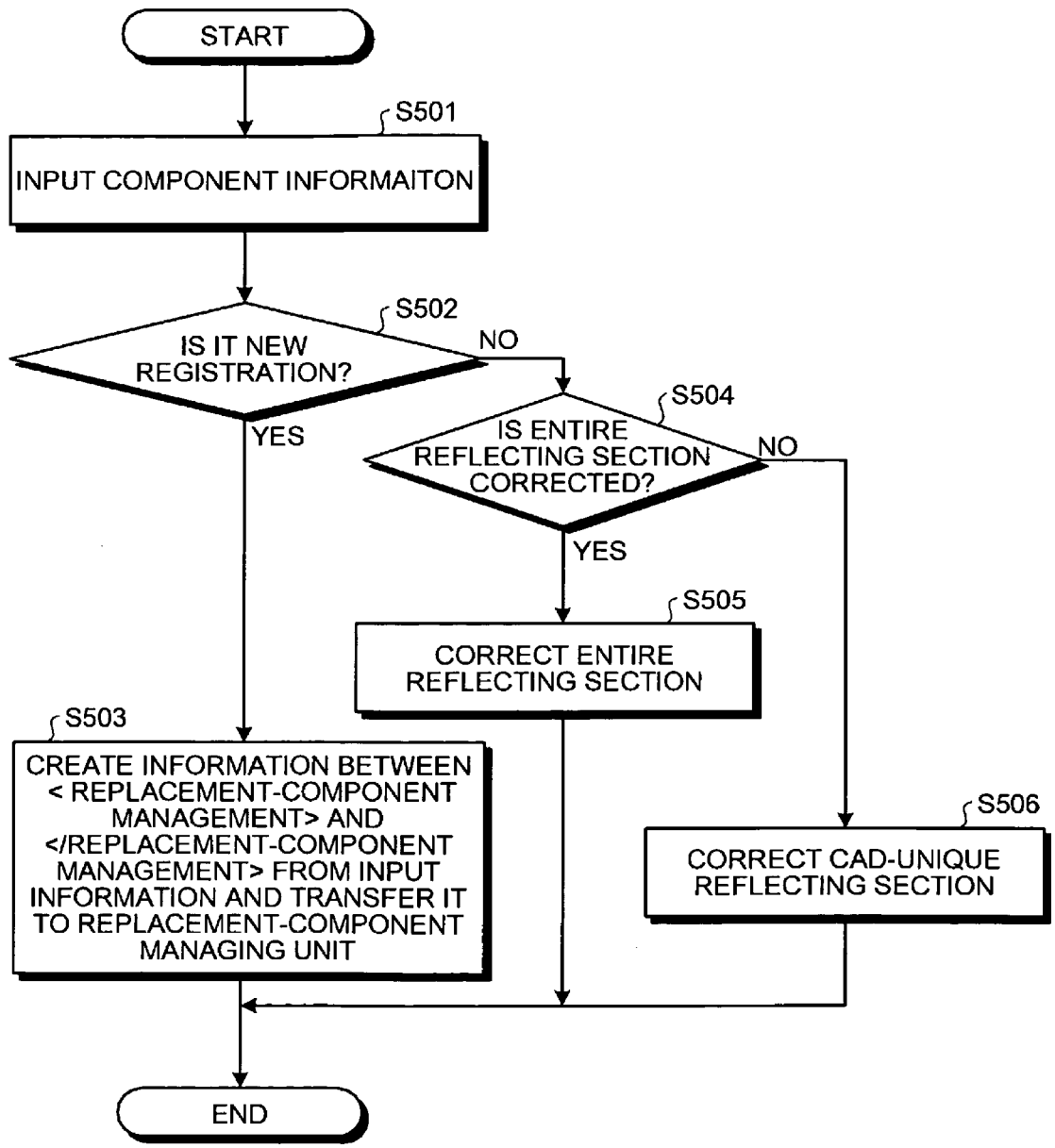
FIG. 17 is a flowchart of the operation of an replacement-component-information registering unit shown in FIG. 11.

FIG. 17 is a flowchart of the operation of the replacement-component-information registering unit 280. The replacement-component-information registering unit 280 receives component information for the electrical CAD and the mechanical CAD for each component (step S501). More specifically, the replacement-component-information registering unit 280 receives a component identification name and a shape library name in an electrical CAD, a mechanical CAD name, a component identification name in the mechanical CAD, and differences (differences in X, Y, and Z directions and a difference in rotation angle) in coordinates between the electrical CAD and the mechanical CAD, for each component.

The replacement-component-information registering unit 280 determines whether registration of a component is new registration using the component identification name in the electrical CAD (step S502). When it is the new registration, information of <replacement-component management> to </replacement-component management> is newly created from the component information, and submits the registration to the replacement-component managing unit 250 (step S503).

When it is not the new registration, it is determined whether the whole reflection is to be corrected (step S504). When the whole reflection is to be corrected, the replacement-component-information registering unit 280 corrects the whole reflection in <replacement-component management> to </replacement-component management> (step S505). When the whole reflection is not corrected, the CAD-specific reflection in <replacement-component management> to </replacement-component management> is corrected (step S506).

In this manner, the replacement-component-information registering unit 280 registers therein the information for the components of the electrical CAD and the information for the components of the mechanical CAD in association with each other, to thereby enable replacement of the component information for the electrical CAD with the component information for the mechanical CAD.

As explained above, according to the embodiment, when the base plane specified by the user contains different levels, i.e., when components are 1 mounted on the printed circuit board specified by the user, the calculation-basis determining unit 140 of the height-limited-area-information creating device 100 determines whether to use a single calculation basis (the level of the printed circuit board) or a plurality of calculation bases (levels of the printed circuit board and the component) to calculate the height limit based on the setting information. When the height-limit calculation is performed using a single basis, the components mounted on the printed circuit board are removed, and the maximum-height calculating unit 160 calculates the height limit with respect to the base plane determined by the calculation-basis determining unit 140. Therefore, the height-limited-area information can be created based on the level of the printed circuit board or the levels of the printed circuit board and the component irrespective of whether or not components are mounted on the printed circuit board.

Moreover, the area dividing unit 150 of the height-limited-area-information creating device 100 uniformly divides the base plane determined by the calculation-basis determining unit 140 into unit areas, and the maximum-height calculating unit 160 calculates the height limit for each of the unit areas obtained through division. Thus, the height-limited-area information even for the chassis with a free-form surface can be calculated.

Furthermore, the maximum-height calculating unit 160 of the height-limited-area-information creating device 100 creates a clip plane on the base plane of the printed circuit board, and sets a view, so that the image faces the base plane and the normal to the base plane corresponds to the depth direction of the image, to create a three-dimensional image of a chassis-side component according to the set view. The maximum-height calculating unit 160 selects one of the unit areas obtained through division of the base plane by the area dividing unit 150, and converts the coordinates of each vertex of the selected unit area to screen coordinates to acquire a component and a polygon at the position of the converted coordinates. A distance from each vertex to the polygon is calculated as a height, and the minimum value of heights calculated from four vertices is set as the maximum height for the unit area. Therefore, the maximum-height calculating unit 160 can calculate the maximum height at higher speed as compared with the case where it is determined whether an intersection of the normal from a vertex with a polygon is within the polygon to acquire a polygon as an object to calculate the distance.

Moreover, the IDF input unit 220 of the shape detailing device 200 reads the IDF created by the electrical CAD machine 20 to store the IDF in the model-information storing unit 230. The component-information converting unit 240 replaces the component information for the electrical component stored in the model-information storing unit 230 with the component information for the mechanical CAD using the replacement-component information managed by the replacement-component managing unit 250, and the IDF output unit 290 outputs the IDF converted into the component information for the mechanical CAD. Therefore, the mechanical CAD machine 10 reads the IDF output by the shape detailing device 200, to thereby enable checking of interference with higher precision. The mechanical CAD machine 10 handles high-precision three-dimensional model information, and this allows the height-limited-area-information creating device 100 to create high-precision height-limit information.

In the above embodiment, the height-limited-area-information creating device 100 and the shape detailing device 200 are explained as hardware; however, they can be implemented as software. In other words, computer programs can be executed on a computer to realize the same function as the height-limited-area-information creating device 100 and the shape detailing device 200. The computer programs can be executed on a similar computer and thus a computer is explained that executes a computer program (hereinafter, height-limited-area-information creating program) to implement the height-limited-area-information creating device 100.

Figure 18:
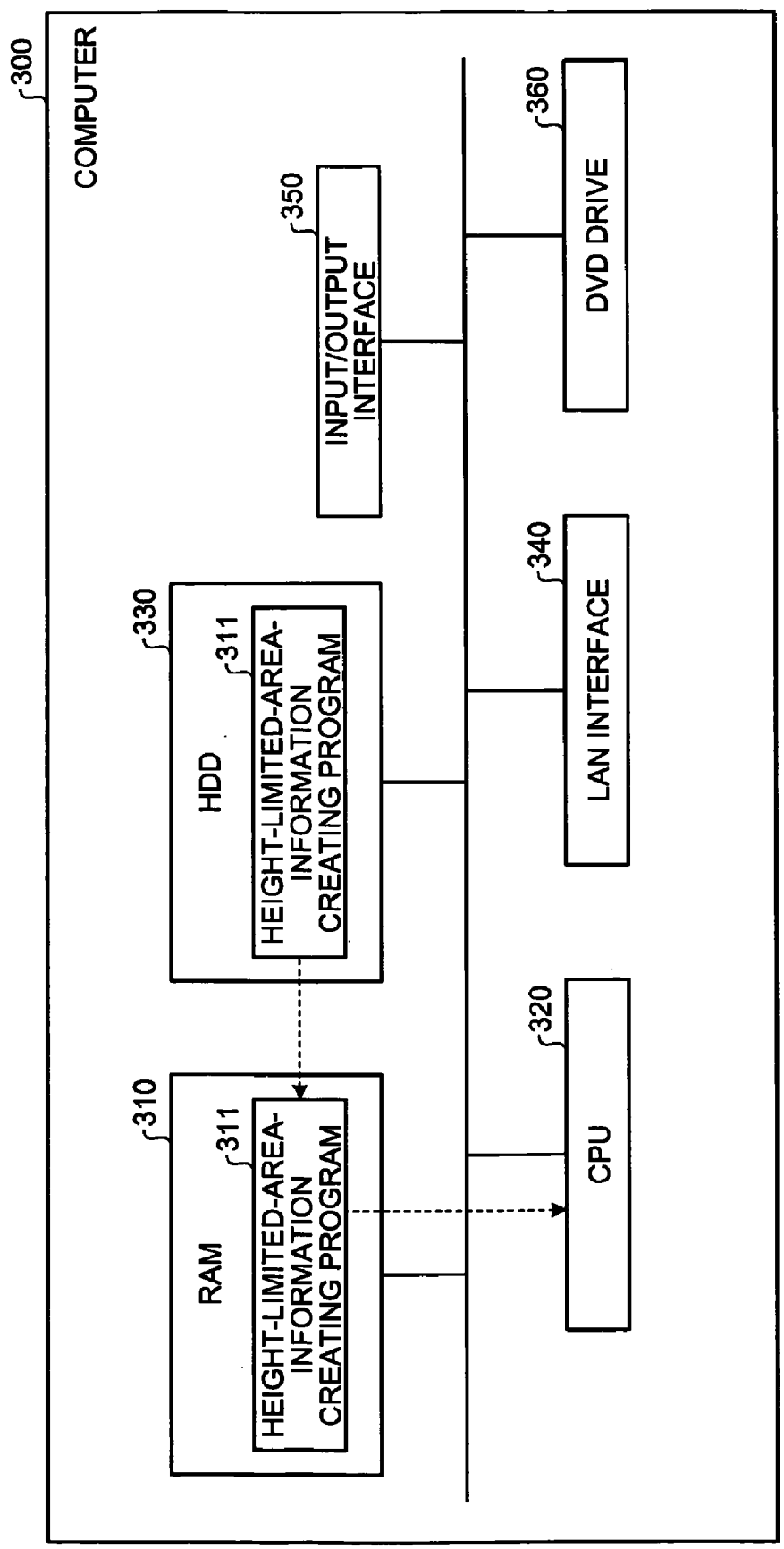
FIG. 18 is a functional block diagram of a computer that executes a computer program according to the embodiment.

FIG. 18 is a functional block diagram of a computer 300 that executes the height-limited-area-information creating program. The computer 300 includes a random access memory (RAM) 310, a central processing unit (CPU) 320, a hard disk drive (HDD) 330, a local area network (LAN) interface 340, an input/output interface 350, and a digital versatile disk (DVD) drive 360.

The RAM 310 stores therein a program and an execution result during execution of the program, or the like. The CPU 320 reads the program from the RAM 310 to execute the program. The HDD 330 stores therein programs and data. The LAN interface 340 is used to connect the computer 300 to another computer through the LAN. The input/output interface 350 is used to connect an input device such as a mouse and a keyboard and a display device to the computer 300, and the DVD drive 360 reads/writes data from/to the DVD.

A height-limited-area-information creating program 311 executed in the computer 300 is stored in the DVD, and is read from the DVD by the DVD drive 360, to be installed into the computer 300. Alternatively, the height-limited-area-information creating program 311 is stored in databases in other computer systems connected thereto through the LAN interface 340, and is read from the databases to be installed on the computer 300. The installed height-limited-area-information creating program 311 is stored in the HDD 330, and is loaded into the RAM 310 to be executed by the CPU 320.

In the embodiment, while the height-limited-area-information creating device 100 and the shape detailing device 200 are provided separately from the mechanical CAD machine 10 and the electrical CAD machine 20, the functions of the height-limited-area-information creating device 100 and the shape detailing device 200 can be included in the mechanical CAD machine 10 or in the electrical CAD machine 20. For example, the functions of the shape detailing device 200 can be included in the mechanical CAD machine 10. In this case, however, after replacing the component information, the mechanical CAD machine 10 creates a shape and lays out components using the replaced component information without outputting it in the IDF format. Alternatively, the functions of the height-limited-area-information creating device 100 and the shape detailing device 200 can be combined to form a mechanical CAD-electrical CAD collaboration device.

In the embodiment, the printed circuit board of the information processing device is set as the base plane to create height-limit information for the space in the chassis, but the present invention is not so limited. For example, the floor of a building can be set as the base plane to create the height-limit information for a space in the building.

As set forth hereinabove, according to the embodiment of the present invention, the height limit is calculated at high speed, and this enables to create the height-limited-area information for a large scale of three-dimensional structure. In addition, the three-dimensional image is efficiently created, and this enables to calculate the height limit at high speed.

Moreover, each face of a three-dimensional structure is accurately expressed, and this enables to precisely calculate the height limit. The height limit is calculated for the height from the printed circuit board to the chassis, and this enables to reflect the result of chassis design in the electrical design.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:
1. A height-limit calculation apparatus comprising:
  an image creating unit that sets a clip plane at a position of a base plane, sets a view for an image so that a direction of the image is opposite to the base plane and a normal to the base plane represents a depth direction of the image, and creates a three-dimensional image according to the view based on three-dimensional shape information of a three-dimensional structure including a plurality of sub-structures which are laid out and combined with a space; and a calculating unit that calculates a height limit for the space from a measurement point on the base plane by converting the measurement point to a position on screen coordinates of the three-dimensional image and calculating a distance from the measurement point to a three-dimensional shape present at the position based on the three-dimensional shape information.

2. The height-limit calculation apparatus according to claim 1, further comprising an information limiting unit that removes three-dimensional shape information of a sub-structure outside a cubic area that includes the base plane as a bottom and extends in a height direction in which the height limit is calculated to limit the three-dimensional shape information, wherein the image creating unit creates the three-dimensional image based on limited three-dimensional shape information.

3. The height-limit calculation apparatus according to claim 1, wherein the three-dimensional shape, the distance to which from the measurement point is calculated, has a surface represented by a polygon.

4. The height-limit calculation apparatus according to claim 1, wherein the three-dimensional structure is a device that includes a printed circuit board and a chassis, the base plane is a surface of the printed circuit board, and the height limit is a maximum limit of a height of the space from the base plane to the chassis.

5. A height-limit calculation method comprising:

setting a clip plane at a position of a base plane;

setting a view for an image so that a direction of the image is opposite to the base plane and a normal to the base plane represents a depth direction of the image;

creating a three-dimensional image according to the view based on three-dimensional shape information of a three-dimensional structure including a plurality of sub-structures which are laid out and combined with a space; and calculating a height limit for the space from a measurement point on the base plane by converting the measurement point to a position on screen coordinates of the three-dimensional image and calculating a distance from the measurement point to a three-dimensional shape present at the position based on the three-dimensional shape information.

6. The height-limit calculation method according to claim 5, further comprising removing three-dimensional shape information of a sub-structure outside a cubic area that includes the base plane as a bottom and extends in a height direction in which the height limit is calculated to limit the three-dimensional shape information, wherein the creating includes creating the three-dimensional image based on limited three-dimensional shape information.

7. The height-limit calculation method according to claim 5, wherein the three-dimensional shape, the distance to which from the measurement point is calculated, has a surface represented by a polygon.

8. The height-limit calculation method according to claim 5, wherein the three-dimensional structure is a device that includes a printed circuit board and a chassis, the base plane is a surface of the printed circuit board, and the height limit is a maximum limit of a height of the space from the base plane to the chassis.

9. A computer-readable recording medium that stores therein a computer program causing a computer to execute:

setting a clip plane at a position of a base plane;

setting a view for an image so that a direction of the image is opposite to the base plane and a normal to the base plane represents a depth direction of the image;

creating a three-dimensional image according to the view based on three-dimensional shape information of a three-dimensional structure including a plurality of sub-structures which are laid out and combined with a space; and calculating a height limit for the space from a measurement point on the base plane by converting the measurement point to a position on screen coordinates of the three-dimensional image and calculating a distance from the measurement point to a three-dimensional shape present at the position based on the three-dimensional shape information.

10. The computer-readable recording medium according to claim 9, wherein the computer program further causing the computer to execute removing three-dimensional shape information of a sub-structure outside a cubic area that includes the base plane as a bottom and extends in a height direction in which the height limit is calculated to limit the three-dimensional shape information, and the creating includes creating the three-dimensional image based on limited three-dimensional shape information.

11. The computer-readable recording medium according to claim 9, wherein the three-dimensional shape, the distance to which from the measurement point is calculated, has a surface represented by a polygon.

12. The computer-readable recording medium according to claim 9, wherein the three-dimensional structure is a device that includes a printed circuit board and a chassis, the base plane is a surface of the printed circuit board, and the height limit is a maximum limit of a height of the space from the base plane to the chassis.

13. A method of manufacturing a three-dimensional structure comprising:

setting a clip plane at a position of a base plane;

setting a view for an image so that a direction of the image is opposite to the base plane and a normal to the base plane represents a depth direction of the image;

creating a three-dimensional image according to the view based on three-dimensional shape information of a three-dimensional structure including a plurality of sub-structures which are laid out and combined with a space; and calculating a height limit for the space from a measurement point on the base plane by converting the measurement point to a position on screen coordinates of the three-dimensional image and calculating a distance from the measurement point to a three-dimensional shape present at the position based on the three-dimensional shape information.

* * * * *